(12) United States Patent
Lin et al.

(10) Patent No.: US 10,790,164 B1
(45) Date of Patent: Sep. 29, 2020

(54) METHOD FOR FORMING PACKAGE STRUCTURE

(71) Applicant: Taiwan Semiconductor Manufacturing Co., Ltd., Hsinchu (TW)

(72) Inventors: Wen-Yi Lin, New Taipei (TW); Che-Chia Yang, Taipei (TW); Kuang-Chun Lee, New Taipei (TW); Yu-Sheng Lin, Zhubei (TW); Po-Yao Lin, Hsinchu County (TW); Shin-Puu Jeng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/439,944

(22) Filed: Jun. 13, 2019

(51) Int. Cl.
| | |
|---|---|
| *H01L 23/373* | (2006.01) |
| *H01L 21/56* | (2006.01) |
| *H01L 23/00* | (2006.01) |
| *H01L 23/31* | (2006.01) |
| *H01L 23/48* | (2006.01) |
| *H01L 23/522* | (2006.01) |
| *H01L 25/065* | (2006.01) |
| *H01L 23/29* | (2006.01) |

(52) U.S. Cl.
CPC .......... *H01L 21/565* (2013.01); *H01L 21/563* (2013.01); *H01L 23/295* (2013.01); *H01L 23/315* (2013.01); *H01L 23/3128* (2013.01); *H01L 23/481* (2013.01); *H01L 23/5226* (2013.01); *H01L 24/09* (2013.01); *H01L 24/17* (2013.01); *H01L 25/0652* (2013.01); *H01L 2224/0401* (2013.01)

(58) Field of Classification Search
CPC ....... H01L 2224/97; H01L 2224/32225; H01L 2924/181; H01L 2224/83101; H01L 21/565
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 10,457,845 | B2 * | 10/2019 | Naito .................. H01L 23/3737 |

(Continued)

*Primary Examiner* — Jaehwan Oh
(74) *Attorney, Agent, or Firm* — McClure, Qualey & Rodack, LLP

(57) ABSTRACT

A method for forming a package structure is provided. The method includes forming a first die over a first substrate, and injecting a molding compound material from a first side of the first die to a second side of the first die. The molding compound material includes a plurality of first fillers, each of the first fillers has a length along a longitudinal axis and a width along a transverse direction, and the length is greater than the width. The method further includes heating the molding compound material to form a package layer over the first die, and the first fillers are substantially parallel to each other.

20 Claims, 34 Drawing Sheets

(56) References Cited

U.S. PATENT DOCUMENTS

| | | | |
|---|---|---|---|
| 2007/0001292 A1* | 1/2007 | Ohta | H01L 24/29 257/718 |
| 2008/0142932 A1* | 6/2008 | Beer | H01L 23/29 257/659 |
| 2014/0138854 A1* | 5/2014 | Arora | H01L 23/3737 257/782 |
| 2019/0275736 A1* | 9/2019 | Yamaguchi | B29C 64/268 |

* cited by examiner

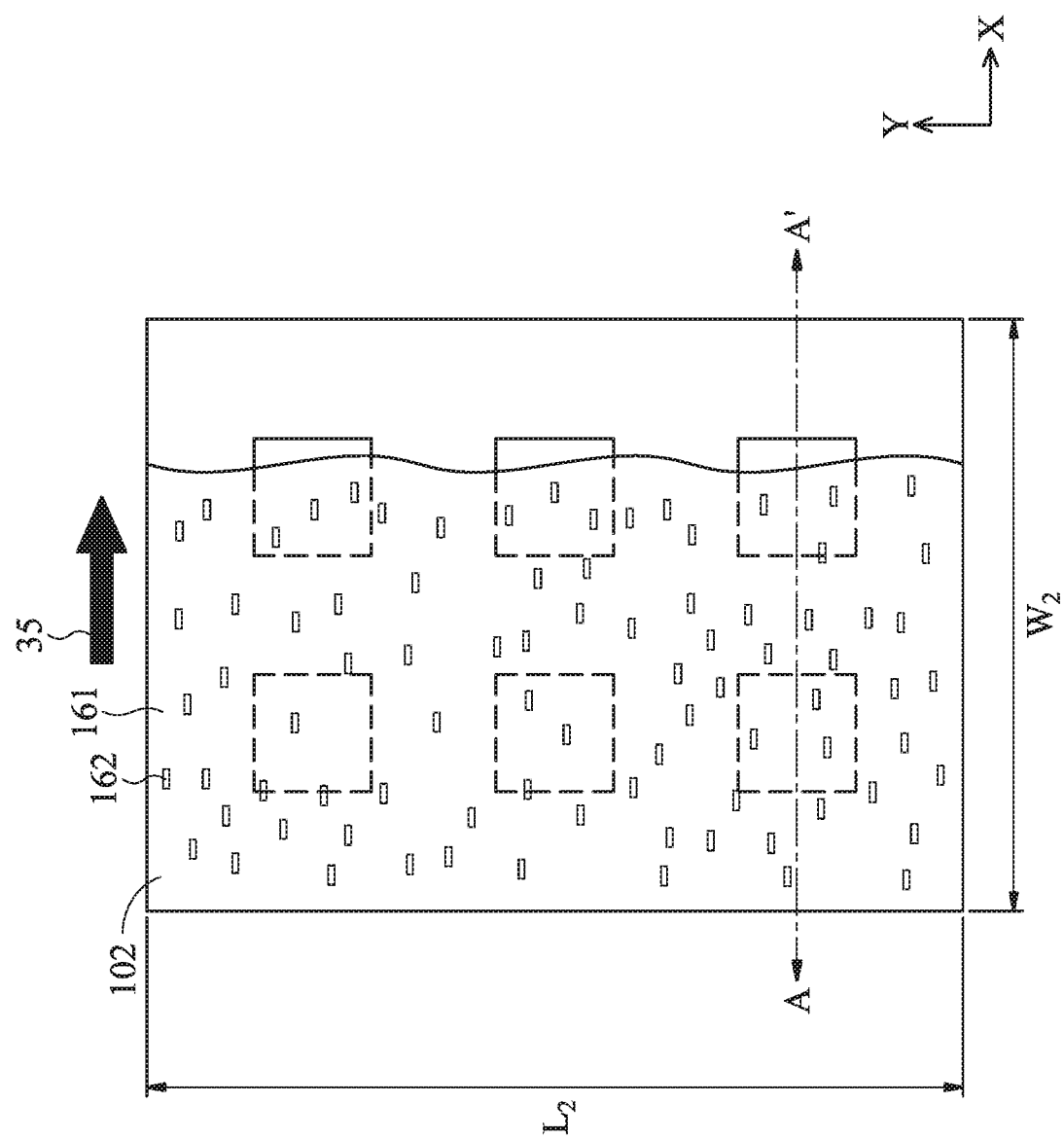

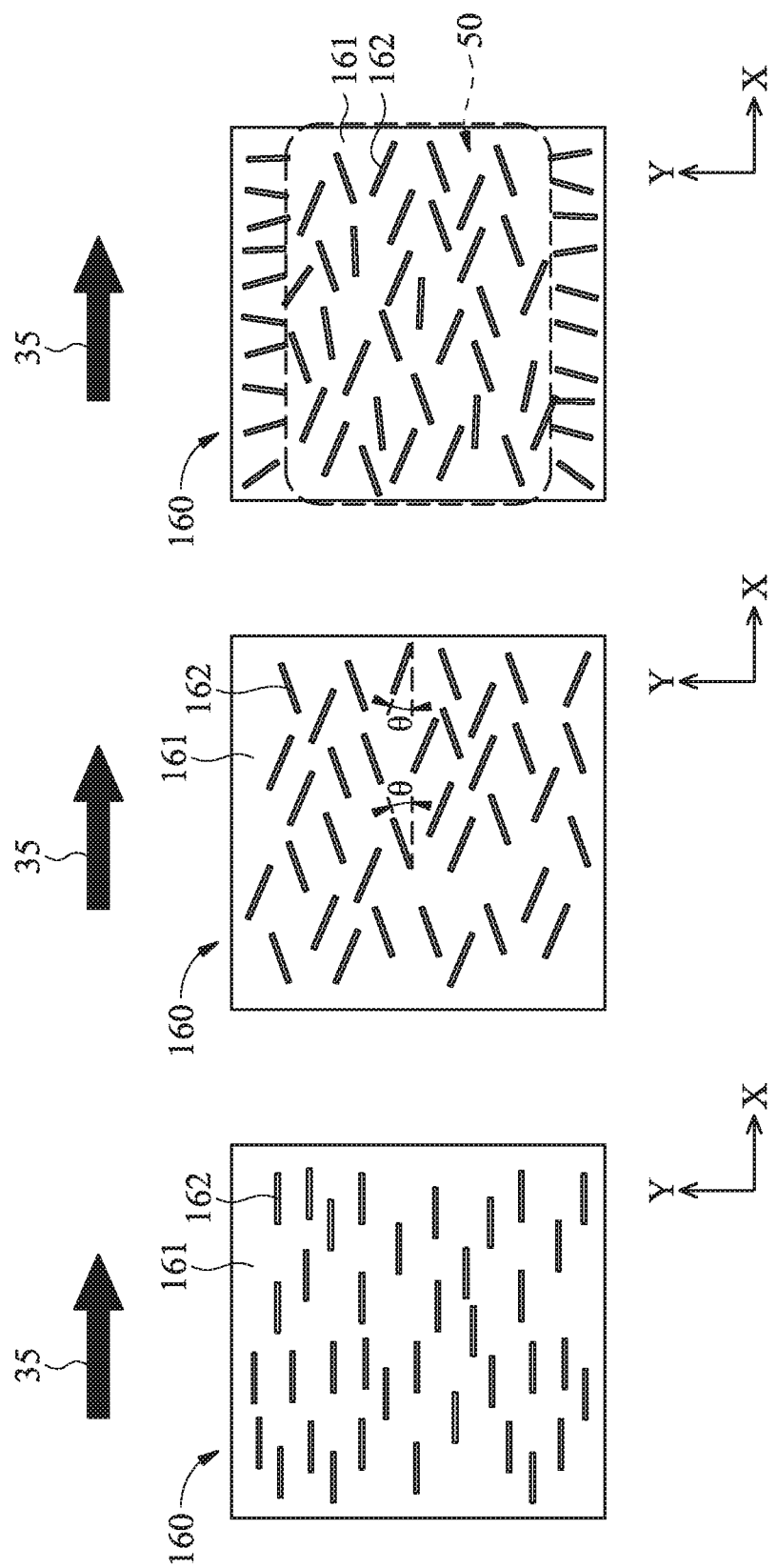

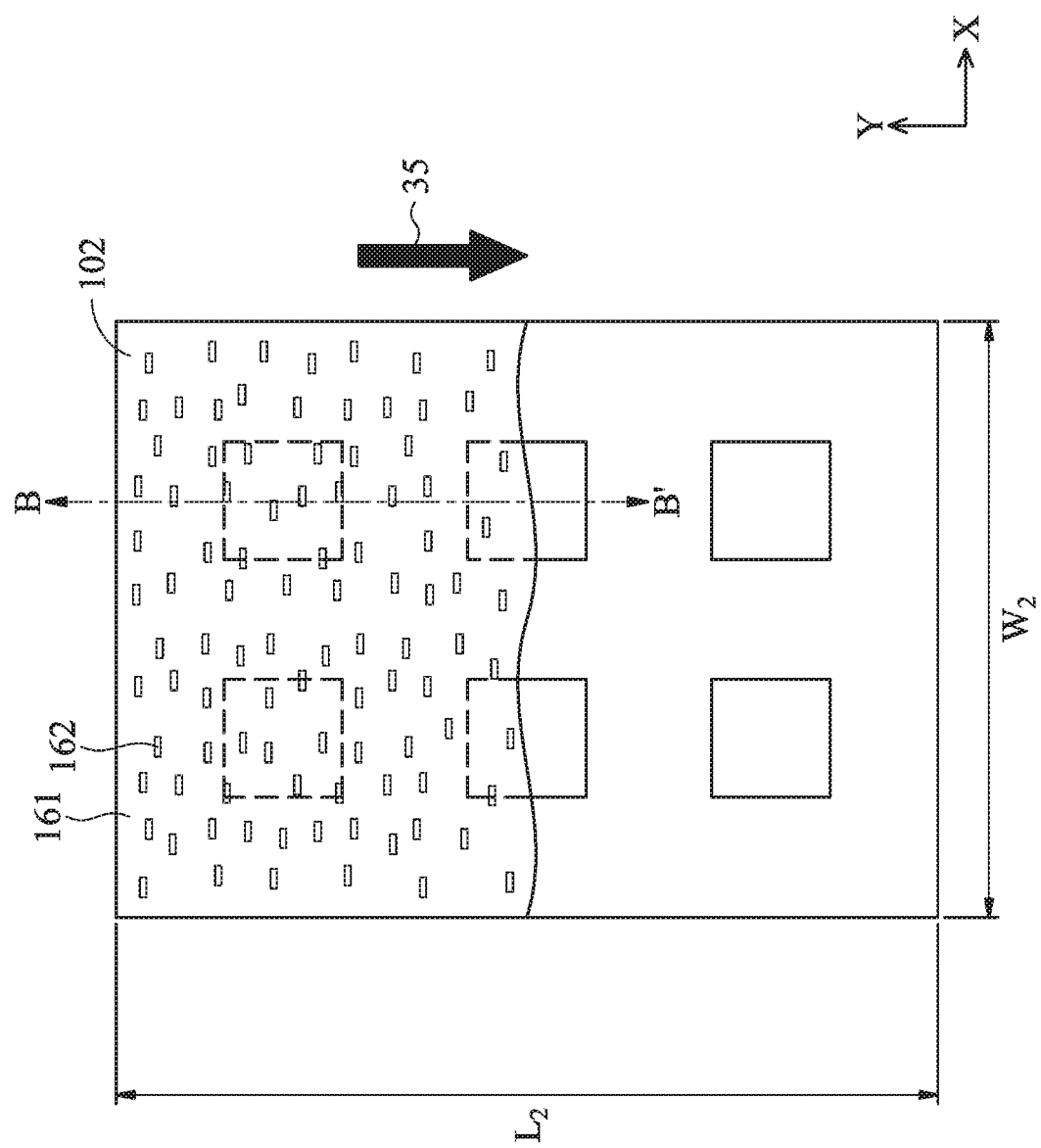

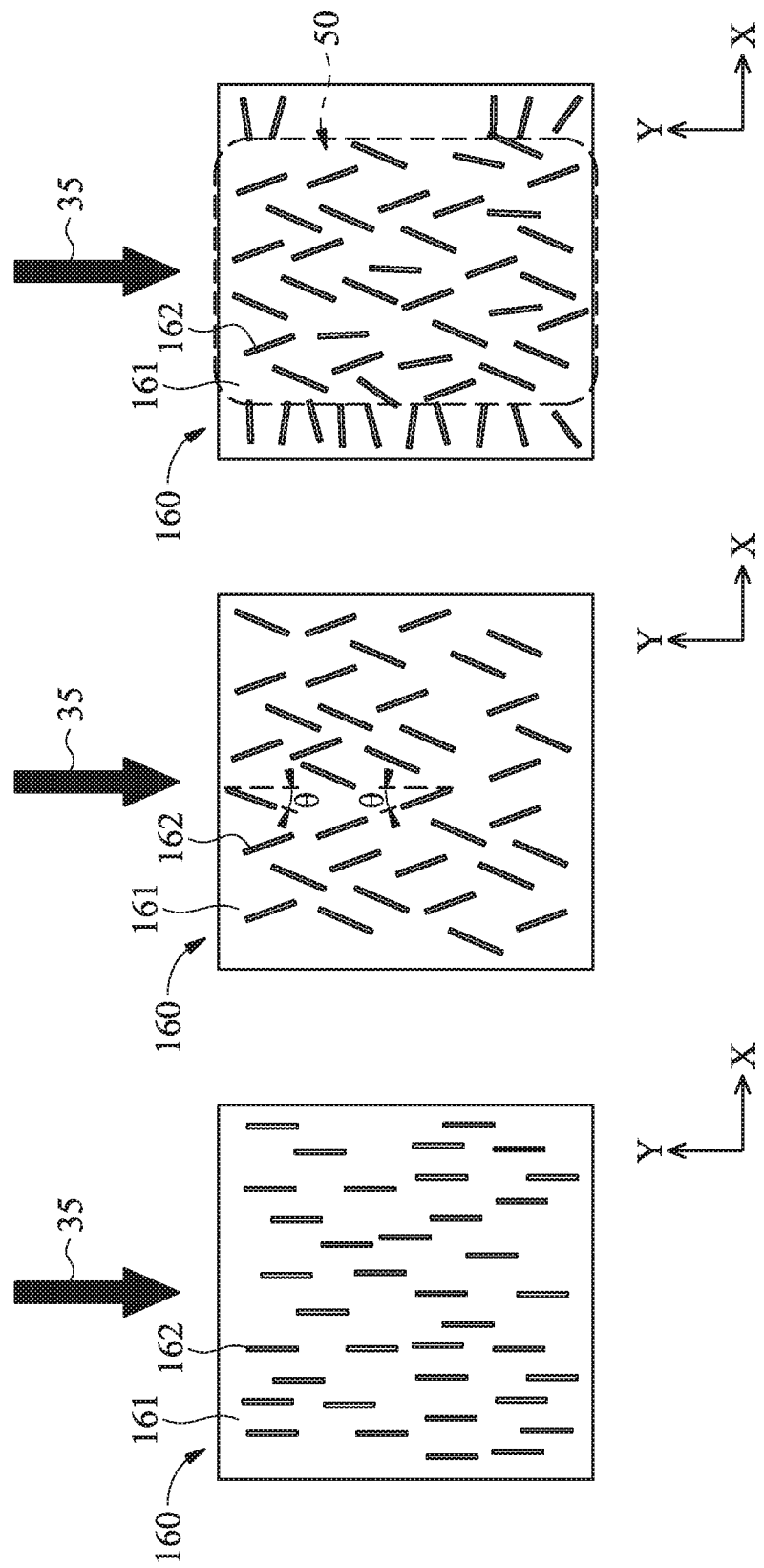

METHOD FOR FORMING PACKAGE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions can be integrated together.

Although existing package structures and methods of fabricating a package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1G' shows a cross-sectional representation of a package structure, in accordance with some embodiments of the disclosure.

FIGS. 4A-4C show top-view representations of various stages of the flowing of the molding compound material with fillers, in accordance with some embodiments of the disclosure.

FIGS. 5A-5C show top-view representations of arrangement of the package layer, in accordance with some embodiments of the disclosure.

FIGS. 6A-6C show top-view representations of various stages of the flowing of the molding compound material with fillers, in accordance with some embodiments of the disclosure.

FIGS. 7A-7C show top-view representations of arrangement of the package layer, in accordance with some embodiments of the disclosure.

DETAILED DESCRIPTION

Figure 1A:
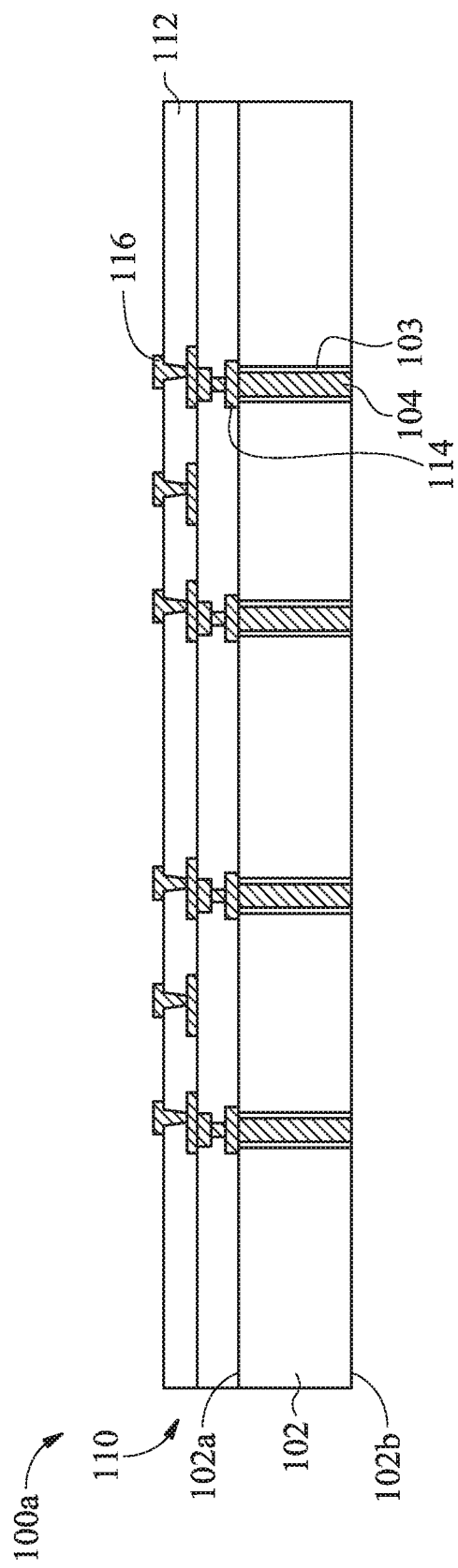
FIGS. 1A-1G show cross-sectional representations of various stages of forming a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for a package structure and method for forming the same are provided. FIGS. 1A-1G show cross-sectional representations of various stages of forming a package structure 100a, in accordance with some embodiments of the disclosure. The package structure 100a may be a chip-on-wafer-on-substrate (CoWoS) package or another suitable package.

As shown in FIG. 1A, a substrate 102 is provided. The substrate 102 includes a front surface 102a and a back surface 102b. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of conductive structures 104 are formed in the substrate 102. The conductive structures 104 extend from the front surface 102a of the substrate 102 towards the back surface 102b of the substrate 102. In some embodiments, the conductive structures 104 are formed by forming a number of trenches (not shown) which extend from the front surface 102a of the substrate 102. Afterwards, a barrier layer 103 is filled into each of the trenches, and the conductive structure 104 is formed on the barrier layer 103 and in each of the trenches.

An interconnect structure 110 is formed over the conductive structures 104 and the substrate 102. The interconnect structure 110 may be used as a redistribution (RDL) structure for routing. The interconnect structure 110 includes multiple conductive layers 114 and conductive pads 116 formed in multiple dielectric layers 112. In some embodiments, the conductive pads 116 are exposed at or protruding from the top surface of the top of the dielectric layers 112 to serve as bonding pads.

The dielectric layers 112 may be made of or include one or more polymer materials. The polymer material(s) may include polybenzoxazole (PBO), polyimide (PI), one or more other suitable polymer materials, or a combination thereof. In some embodiments, some or all of the dielectric layers 112 are made of or include dielectric materials other than polymer materials. The dielectric material may include silicon oxide, silicon carbide, silicon nitride, silicon oxynitride, one or more other suitable materials, or a combination thereof.

The conductive layers 114 and the conductive pads 116 may be made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive layers 114 and the conductive pads 116 are formed by an electroplating, electroless plating, printing, a chemical vapor deposition (CVD) process, or a physical vapor deposition (PVD) process.

Figure 1B:
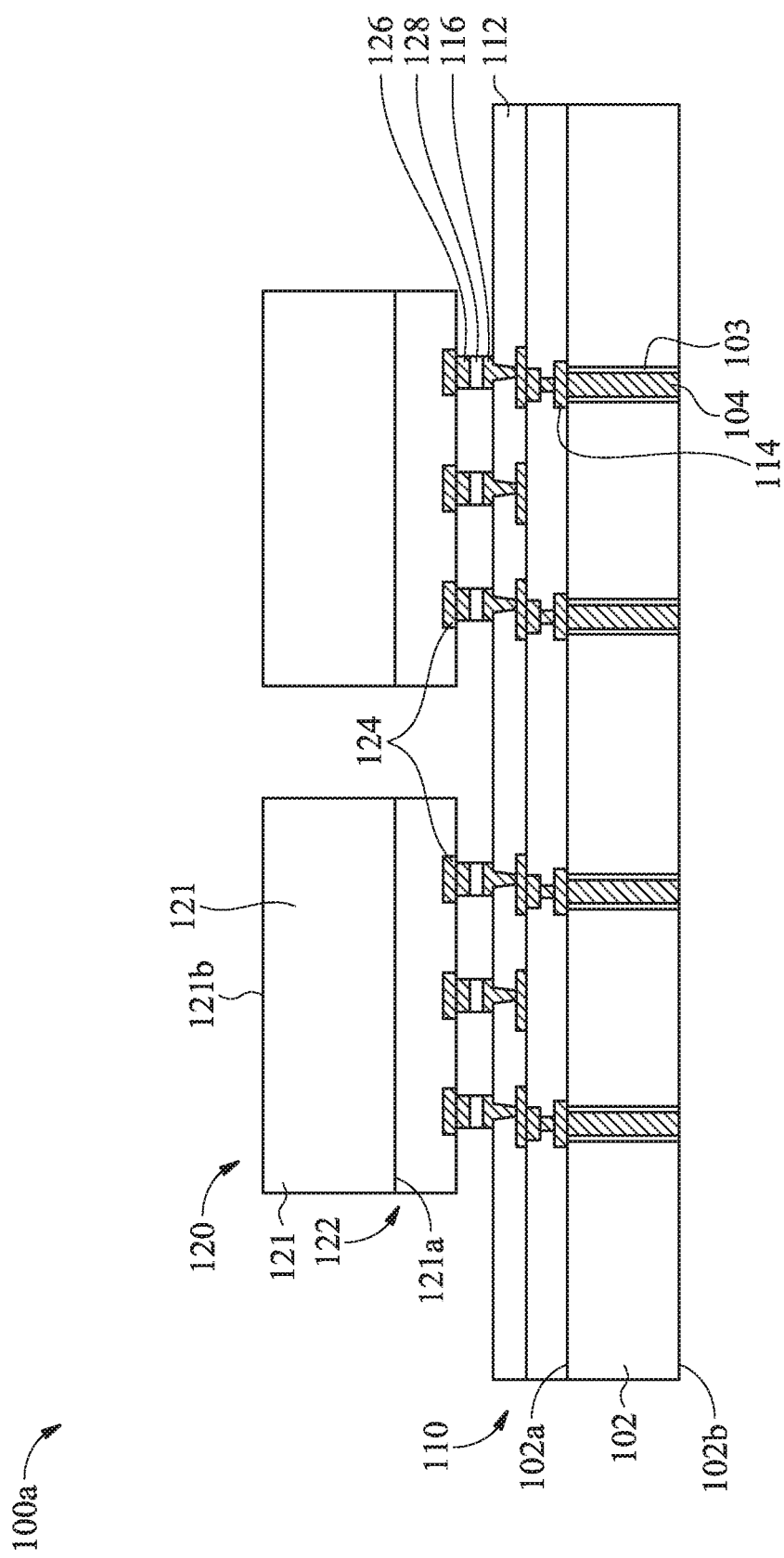

Afterwards, as shown in FIG. 1B, a semiconductor die 120 is formed over the conductive layer 116, in accordance with some embodiments of the disclosure. The semiconductor die 120 includes a substrate 121 and an interconnect structure 122 over the substrate 121. The interconnect structure 122 of the semiconductor die 120 includes a number of conductive layers 124. The substrate 121 includes a top surface 121a and a bottom surface 121b. The interconnect structure 122 is formed on the top surface 121a of the substrate 121, and the bottom surface 121b of the substrate 121 is away from the interconnect structure 122. The interconnect structure 122 includes conductive layers 124.

In some embodiments, the semiconductor die 120 is sawed from a wafer, and may be a "known-good-die". The semiconductor die 120 may be a system-on-chip (SoC) chip or memory die. In some other embodiments, the semiconductor die 120 is a system on integrated circuit (SoIC) device that includes two or more chips with integrated functions. In some embodiments, the memory die includes a static random access memory (SRAM) device, a dynamic random access memory (DRAM) device, a high bandwidth memory (HBM) or other memory dies. The number of semiconductor dies 120 is not limited to two, and the number can be adjusted according to actual application.

In some embodiments, a number of conductive pads 126 are formed below the conductive layers 124 of the semiconductor die 120, and each of the conductive pads 126 is bonded to each of the conductive pads 116 through a number of conductive connectors 128.

The conductive pads 126 are made of metal materials, such as copper (Cu), copper alloy, aluminum (Al), aluminum alloy, tungsten (W), tungsten alloy, titanium (Ti), titanium alloy, tantalum (Ta) or tantalum alloy. In some embodiments, the conductive pad 126 is formed by electroplating, electroless plating, printing, a chemical vapor deposition (CVD) process, or a physical vapor deposition (PVD) process.

The conductive connector 128 is made of solder materials, such as tin (Sn), tin-silver (SnAg), tin-lead (SnPb), tin-copper (SnCu), tin-silver-copper (SnAgCu), tin-silver-zinc (SnAgZn), tin-zinc (SnZn), tin-bismuth-indium (SnBiIn), tin-indium (SnIn), tin-gold (SnAu), tin-zinc-indium (SnZnIn), tin-silver-Antimony (SnAgSb) or another applicable material. In some embodiments, the conductive connector 128 is formed by electroplating, electroless plating, printing, a chemical vapor deposition (CVD) process, or a physical vapor deposition (PVD) process.

Figure 1C:
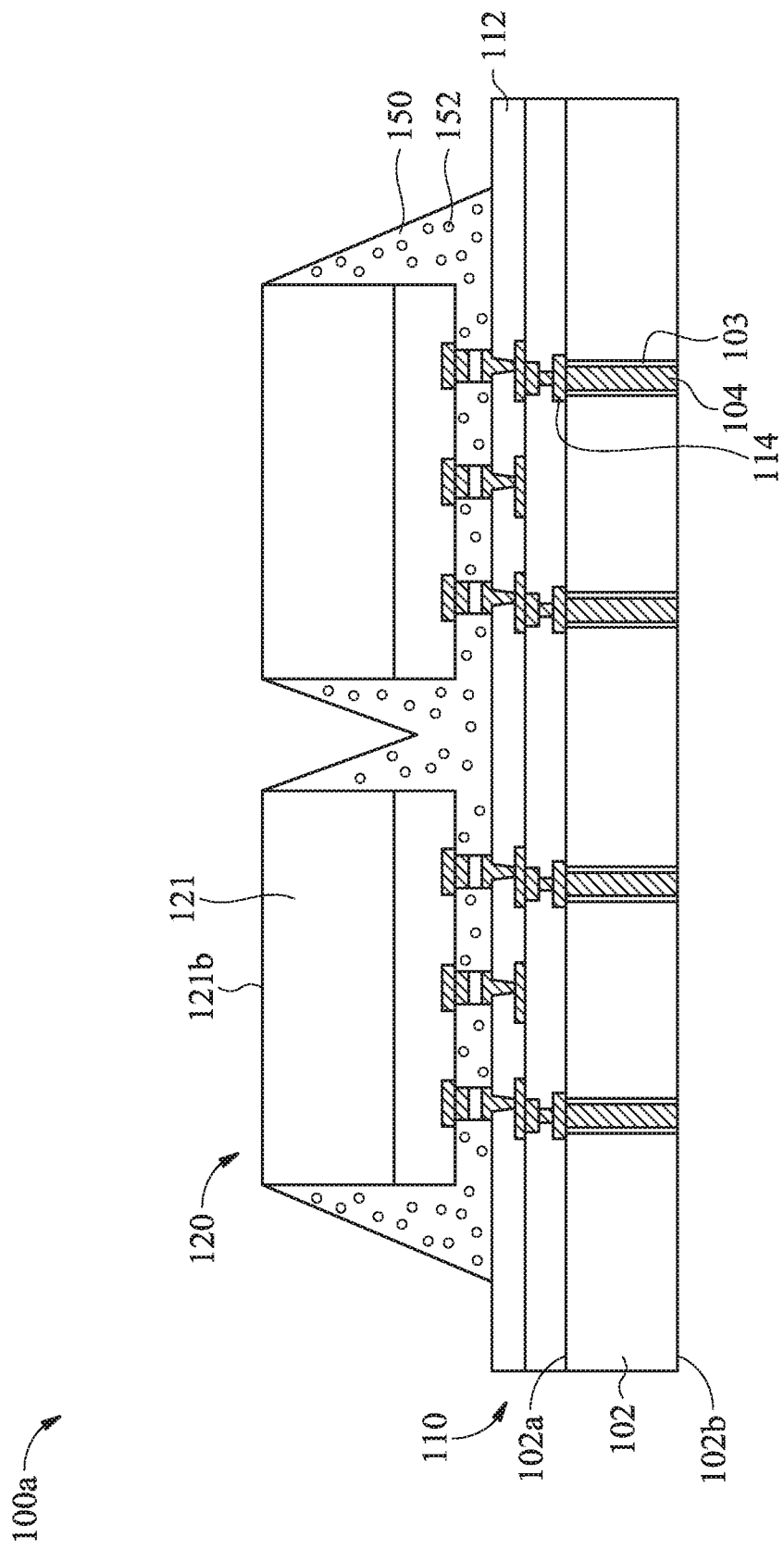

Next, as shown in FIG. 1C, an underfill layer 150 is formed between the semiconductor die 120 and the interconnect structure 110, in accordance with some embodiments of the disclosure. The underfill layer 150 surrounds and protects the conductive connectors 128. In some embodiments, the underfill layer 150 is in direct contact with the conductive connectors 128.

The underfill layer 150 includes a plurality of fillers 152 dispersed in the resin. In some embodiments, the resin is an epoxy-based resin. In some embodiments, the fillers 152 have spherical structure. In some embodiments, the filler 152 of the underfill layer 150 has a diameter in a range from about 1 μm to about 10 μm.

In some embodiments, the filler 152 is made of silicon oxide, aluminum oxide or another applicable material. In some embodiments, the formation of the underfill layer 150 involves an injecting process, a spin-on process, a dispensing process, a film lamination process, an application process, one or more other applicable processes, or a combination thereof. In some embodiments, a thermal curing process is used during the formation of the underfill layer 150.

Figure 1D:
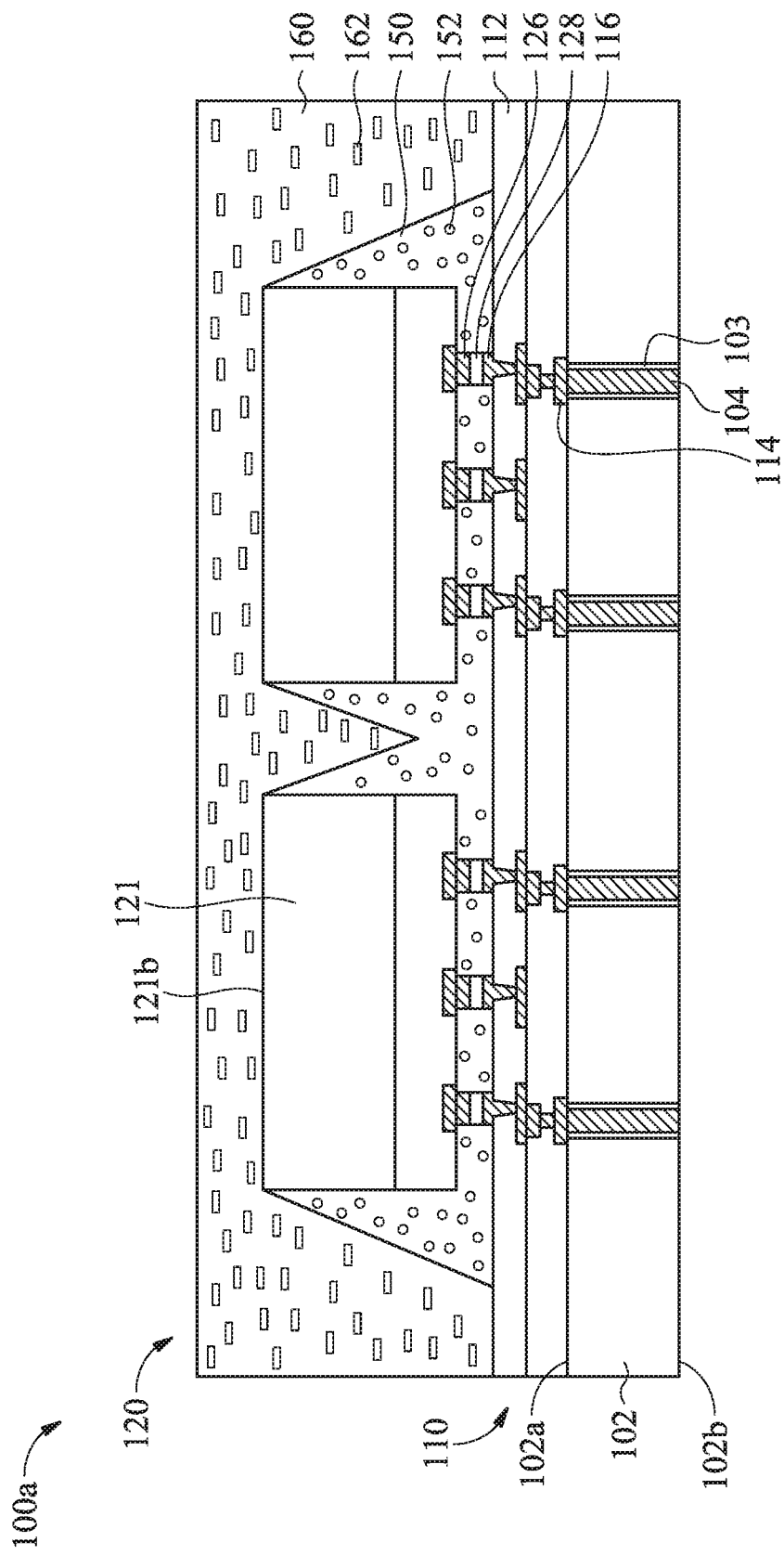

Afterwards, as shown in FIG. 1D, a package layer 160 is formed over the underfill layer 150. The package layer 160 is configured to provide package stiffness, a protective cover and/or a heat conductive path.

There is an interface between the underfill layer 150 and the package layer 160, and the interface is lower than the top surface of the semiconductor die 120. The package layer 160 surrounds and protects the semiconductor dies 120. In some embodiments, the package layer 160 is in direct contact with portions of the semiconductor dies 120.

The package layer 160 is made of a molding compound material. The molding compound material may include a polymer 161 and a number of fillers 162. In some embodiments, the package layer 160 is made of an epoxy-based resin with fillers 162 dispersed therein. In some embodiments, the coefficient of thermal expansion (CTE) of the polymer 161 is greater than the CTE of each of the fillers 162, and therefore the CTE of the fillers 162 is used to reduce the coefficient of thermal expansion (CTE) of the package layer 160. The molding compound material is configured to control the package warpage. When the package warpage is well controlled, the package structure will not be bent during the reflowing process. In addition, the molding compound material is used to improve the heat dissipation.

In some embodiments, the polymer 161 is made of epoxy resin, phenol resin, thermally-set region or another applicable material. In some embodiments, the fillers 162 are made of silica, glass, aluminum oxide, aluminum nitride, boron nitride, beryllium oxide, silicon, silicon carbide or another applicable material. In some other embodiments, the fillers 162 are made of metal materials, such as aluminum (Al), copper (Cu), silver (Ag), gold (Au) or another applicable material. When the fillers 162 are made of metal materials, the fillers 162 have high thermally conductivity to improve the heat dissipation of the package structure 100a.

Figure 2A:
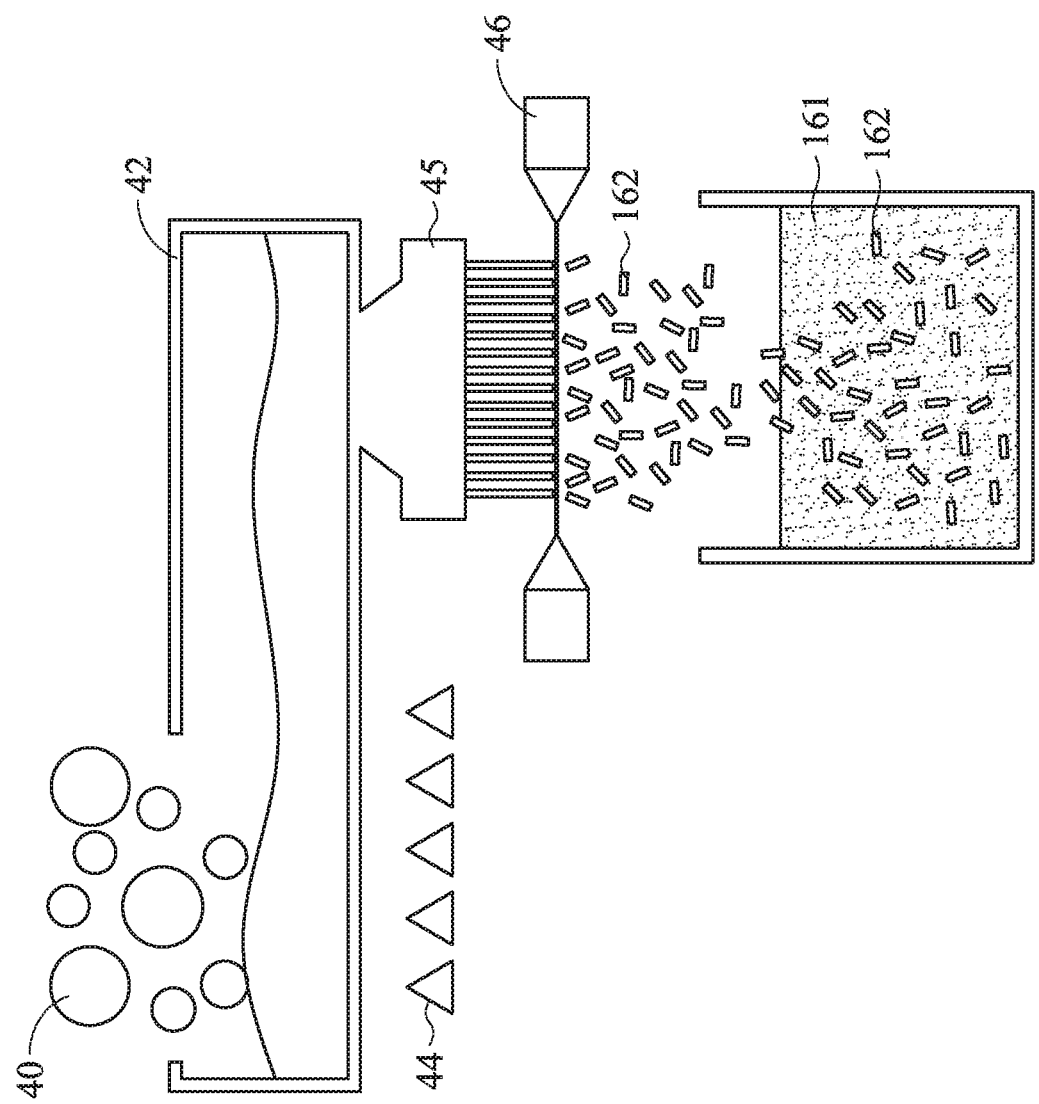
FIG. 2A shows a process for forming the filler, in accordance with some embodiments of the disclosure.

FIG. 2A shows a process for forming the filler 162, in accordance with some embodiments of the disclosure. The raw material 40 is put in a container 42, and then the raw material 40 is melted by a heating device 44. Afterwards, the melted raw material 40 is passed through a forming machine 45 to form a number of strips. Next, the strips are cut by a cutting device to form the filler 162. As a result, the filler 162 has a long strip shape. Afterwards, the fillers 162 are mixed with the polymer 161 to prepare as the molding compound material. In some embodiments, the cutting device 46 is a laser device or electrical discharge device.

Figure 2B:
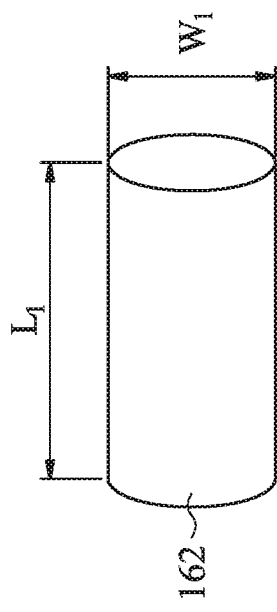
FIGS. 2B-2D show enlarged representations of one of the fillers of the package layer, in accordance with some embodiments of the disclosure.
Figure 2D:
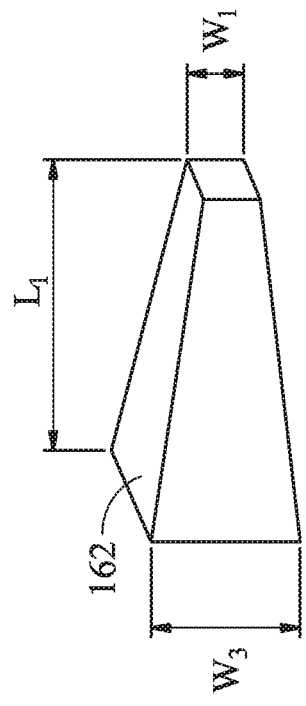
Figure 2C:
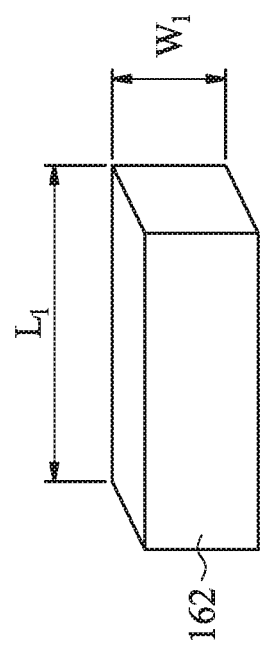

FIGS. 2B-2D show enlarged representations of one of the fillers 162 of the package layer 160, in accordance with some embodiments of the disclosure. The filler 162 has an asymmetric structure.

The filler 162 has a first length $L_1$ along a longitudinal axis and a first width $W_1$ along a transverse direction, the first length $L_1$ is greater than the first width $W_1$. Compared with the isotropic spherical filler 152, the fillers 162 is anisotropic. In some embodiments, the filler 162 has an aspect ratio ($L_1/W_1$) in a range from about 1.05 to about 5. In some embodiments, the first length $L_1$ of the filler 162 is in a range from about 2 µm to about 8 µm. In some embodiments, the average diameter of each of the fillers 152 of the underfill layer 150 is shorter than the average first length $L_1$ of each of the first fillers 162 of the package layer 160. In some embodiments, the coefficient of thermal expansion (CTE) of each of the fillers 162 of the package layer 160 is greater than the CTE of each of the fillers 152 of the underfill layer 150. The overall CTE in the package layer 160 is more adjustable according to the actual application.

As shown in FIG. 2B, the filler 162 has a cylindrical shaped structure. As shown in FIG. 2C, the filler 162 has a strip-shaped structure with a constant width $W_1$. As shown in FIG. 2D, the filler 162 has a strip-shaped structure. The width of the filler 162 is gradually tapered from the third width $W_3$ to the first width $W_1$.

In some embodiments, the fillers 162 have a weight percentage in the package layer 160 in a range from about 60% to about 70%. If the weight percentage of the fillers 162 is greater than 70%, the adhesion of the package layer 160 may be too low to attach to the semiconductor die 120. If the weight percentage of the fillers 162 is lower than 60%, warpage may continue to be a problem.

Figure 3A:
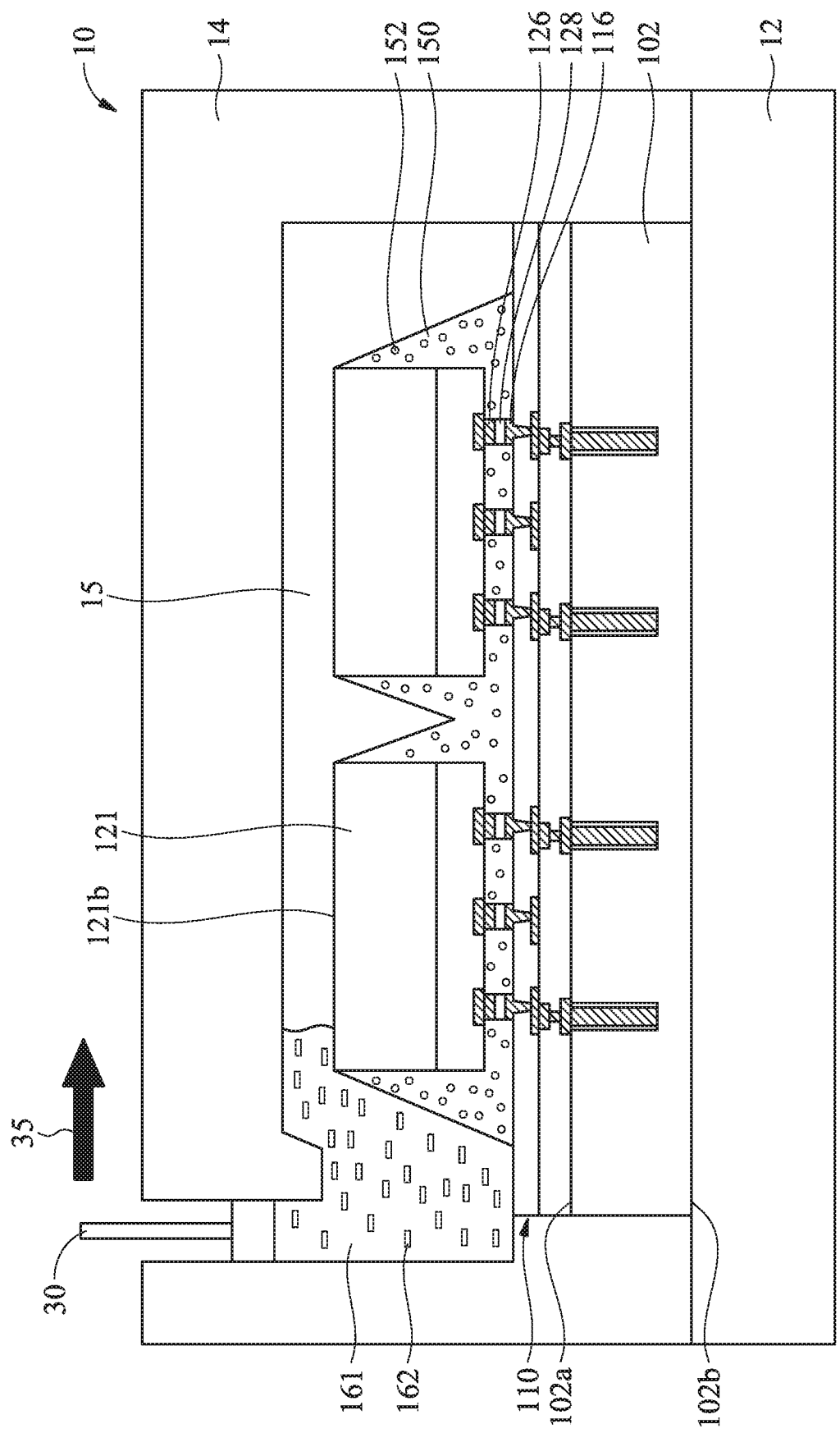
FIGS. 3A-3C show cross-sectional representations of various stages of forming the package layer, in accordance with some embodiments of the disclosure.
Figure 3B:
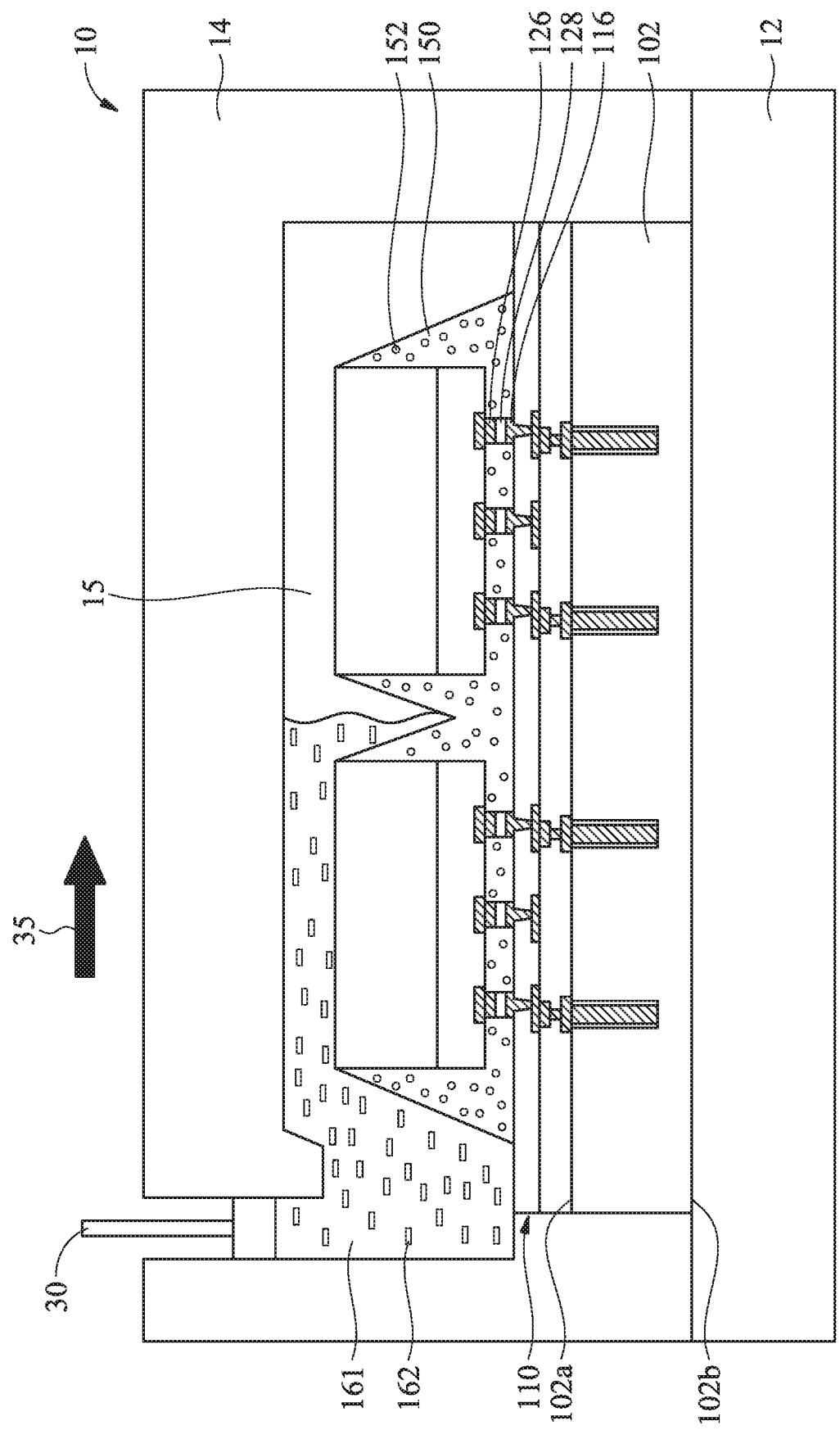
Figure 3C:
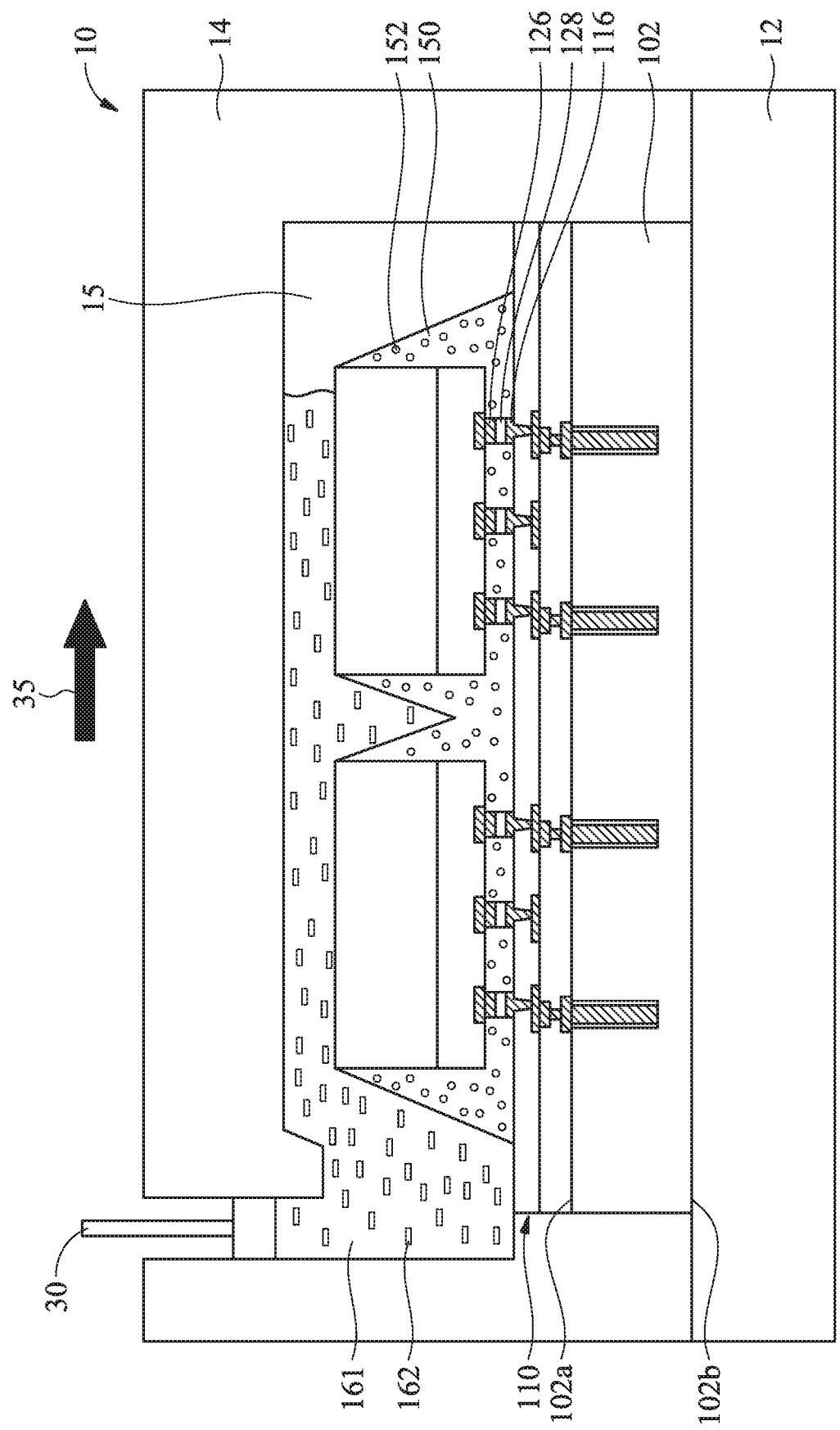

FIGS. 3A-3C show cross-sectional representations of various stages of forming the package layer 160, in accordance with some embodiments of the disclosure.

As shown in FIG. 3A, a simplified view of a transfer molding apparatus 10 is shown. The transfer molding apparatus 10 includes a first mold portion 12, a second mold portion 14 and a mold cavity 15 between the first mold portion 12 and the second mold portion 14. The transfer molding apparatus 10 further includes a transfer arm 30 connected to the mold cavity 15. The transfer arm 30 of the transfer molding apparatus 10 is configured to inject the molding compound material into the mold cavity 15.

The substrate 102 of the package structure 100a of FIG. 1C is disposed in the mold cavity 15. More specifically, the bottom surface 121b of the substrate 121 of the semiconductor die 120 is exposed in the mold cavity 15. Afterwards, the molding compound material is injected into the mold cavity 15 by the transfer arm 30.

As shown in FIG. 3A, the molding compound material is pushed by an injection pressure which is generated by the transfer arm 30, and therefore the molding compound material flows in a direction 35 (shown in arrow). In addition, the fillers 162 flow in the direction 35. The anisotropic fillers 162 have directionality when flowing in the direction 35. More specifically, the fillers 162 have cylindrical-shaped or strip-shaped structures, and therefore the longitudinal axis of each of the fillers 162 is substantially parallel to the direction 135. In some embodiments, the injection pressure is within a range of about 5 MPa to about 18 MPa.

Terms such as "substantially parallel" or "substantially perpendicular" are to be interpreted as not to exclude insignificant deviation from the specified arrangement and may include for example deviations of up to 30°.

In some embodiments, the transfer arm 30 includes a pump. The pump may be a positive displacement pump or other type of pump operable to push the molding compound material into the mold cavity 15. The pump may alternatively be a vacuum pump or other type of pump operable to pull or suck the molding compound material into the mold cavity 15.

Next, as shown in FIG. 3B, the molding compound material flows from a first side of the semiconductor die 120 to a second side of the semiconductor die 120, in accordance with some embodiments of the disclosure. The fillers 162 are substantially parallel to the top surface of the semiconductor die 120. The longitudinal axis of fillers 162 are substantially perpendicular to the extended direction of the through via structure 108.

Afterwards, as shown in FIG. 3C, the molding compound material continues to flow through the mold cavity 15, in accordance with some embodiments of the disclosure.

During the injection of the molding compound material, a first heating process is performed on the substrate 102. After the underfill layer 150 and the semiconductor die 120 are covered by the molding compound material, a second heating process is performed on the substrate 102. The first heating process is configured to help the flowing the molding compound material, and the second heating process is configured to cure the molding compound material and to transform it into the package layer 160 over the semiconductor die 120. The first heating process operates at a first temperature, and the second heating process operates at a second temperature. In some embodiments, the second temperature is greater than the first temperature. In some embodiments, the first temperature is in a range from about 110 degrees Celsius to about 150 degrees Celsius. In some embodiments, the second temperature is in a range from about 150 degrees Celsius to about 170 degrees Celsius.

Figure 1E:
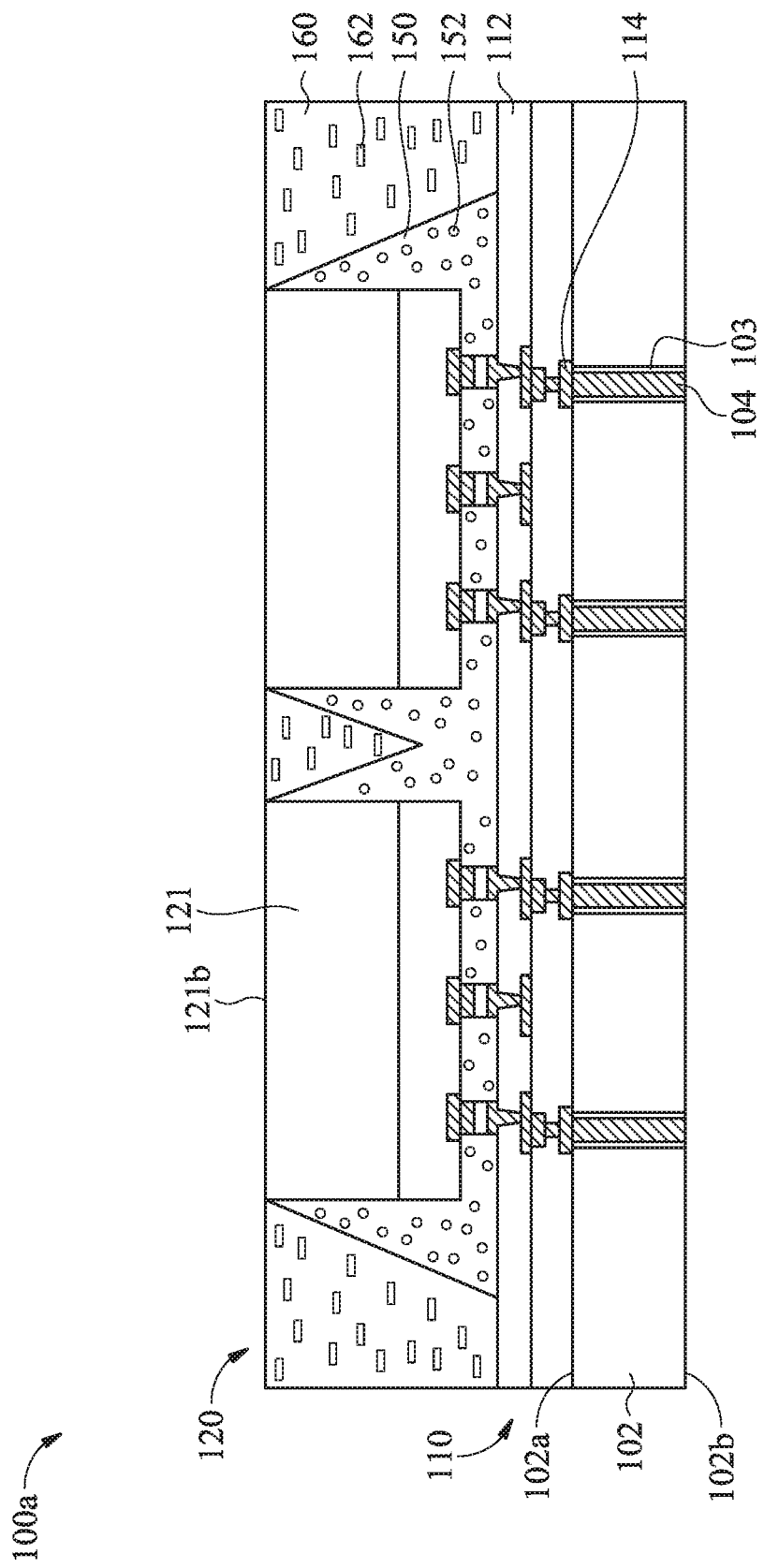

Afterwards, as shown in FIG. 1E, a portion of the package layer 160 is removed, in accordance with some embodiments of the disclosure. As a result, the top surface of the semiconductor dies 120 is exposed. The top surface of the semiconductor die 120 is substantially coplanar with the top surface of the package layer 160. In some embodiments, the package layer 160 is thinned using a planarization process. The planarization process may include a chemical mechanical polishing (CMP) process, a grinding process, an etching process, another applicable process, or a combination thereof.

Figure 1F:
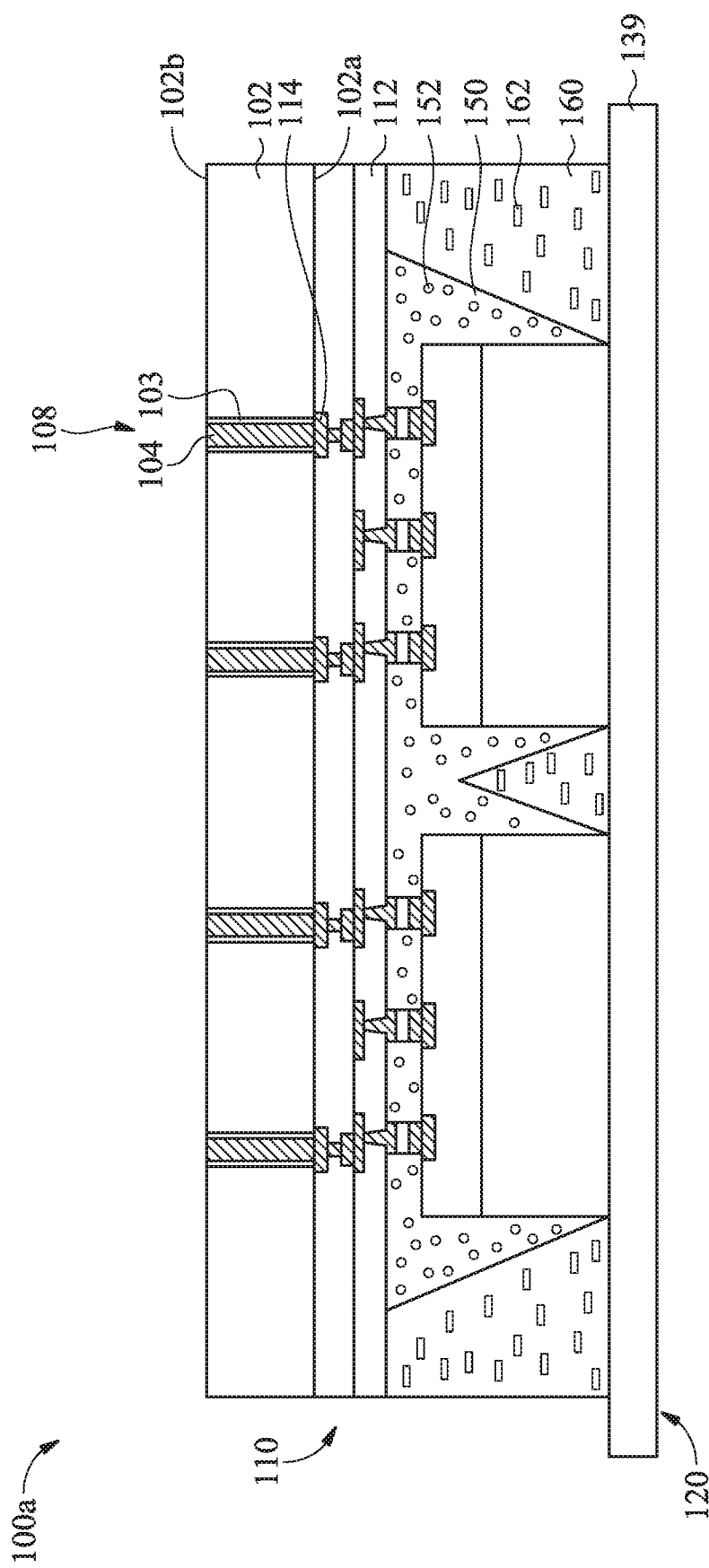

Next, as shown in FIG. 1F, the substrate 102 is turned upside down and placed over a carrier substrate 139, in accordance with some embodiments. In some embodiments, the carrier substrate 139 is used as a temporary substrate. The temporary substrate provides mechanical and structural support during subsequent steps of the process, such as those described in more detail later. The carrier substrate 139 is made of a semiconductor material, ceramic material, polymer material, metal material, another suitable material, or a combination thereof. In some embodiments, the carrier substrate 139 is a glass substrate. In some other embodiments, the carrier substrate 139 is a semiconductor substrate, such as a silicon wafer.

Afterwards, the substrate 102 is thinned using the carrier substrate 139 as support. In some embodiments, the substrate 102 is thinned from the back surface 102b until the conductive structures 104 are exposed. In some embodiments, the conductive structures 104 and the barrier layer 103 become exposed and penetrate through the thinned substrate 102. As a result, a through via structure 108 is formed in the substrate 102. In some embodiments, the through via structure 108 is a through substrate via (TSV) structure. In some other embodiments, the through via structure 108 may be referred to as through-silicon via.

Figure 1G:
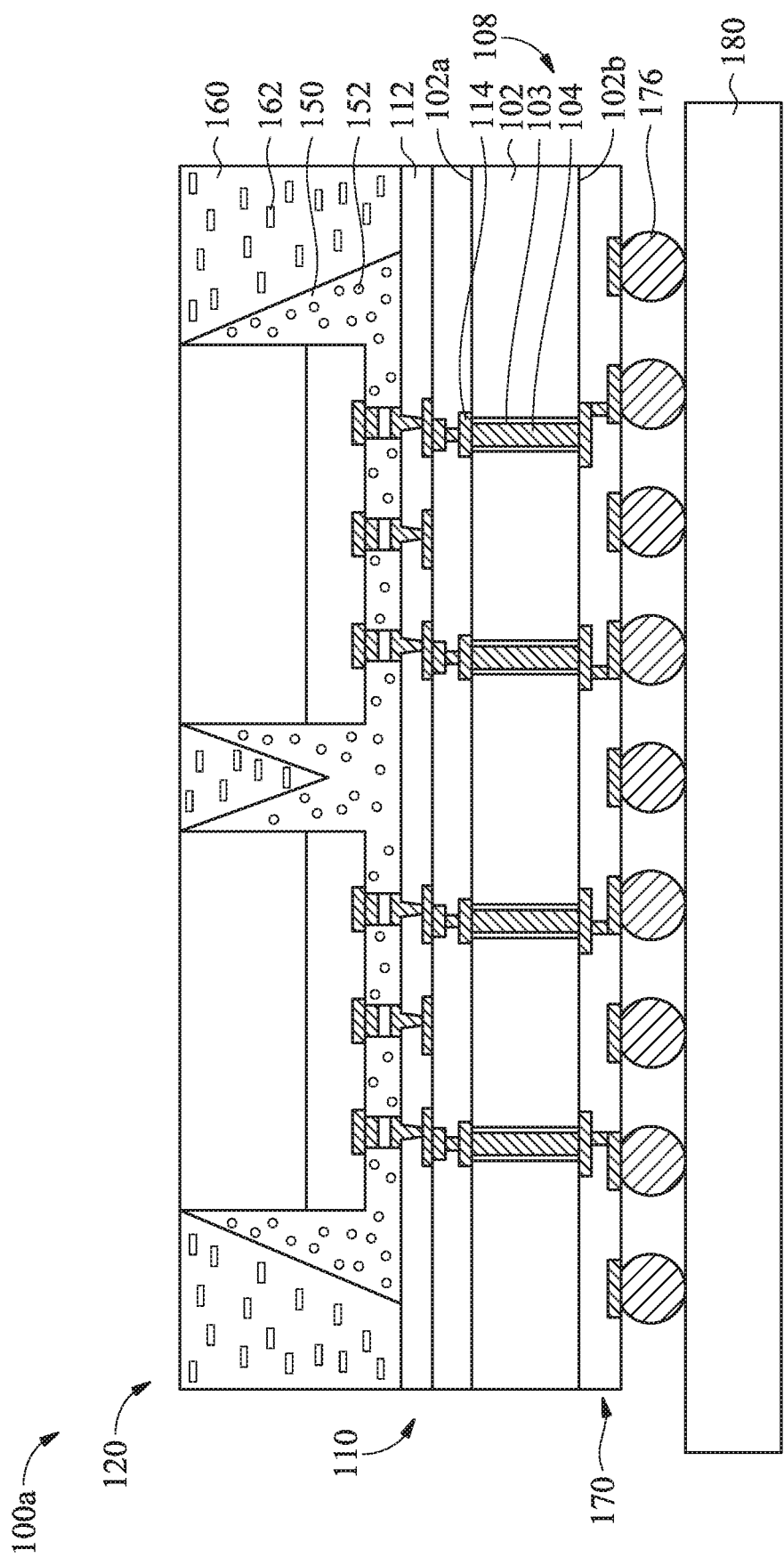
Figure 1G:
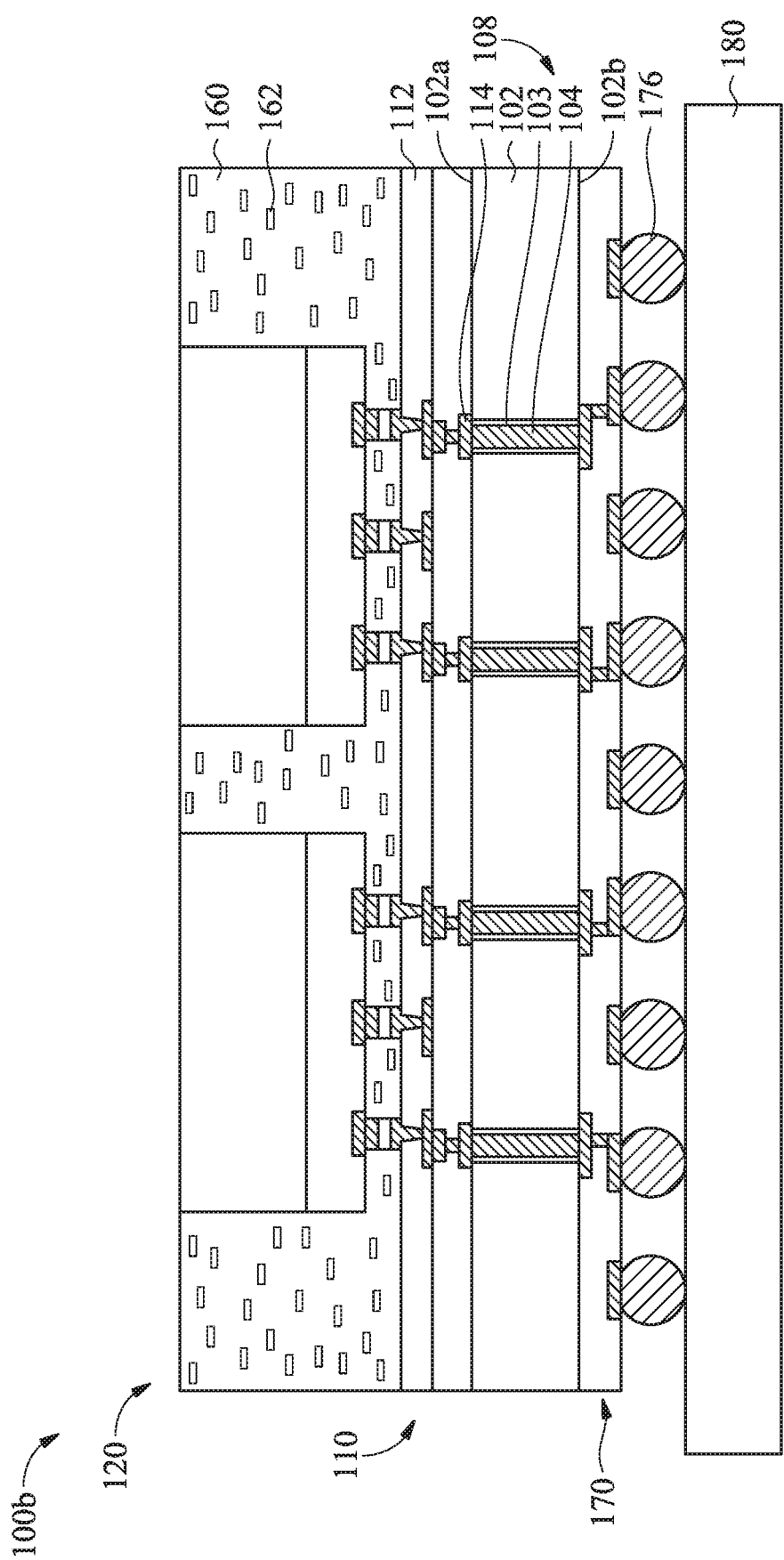

Next, as shown in FIG. 1G, the structure of FIG. 1F is flipped, and an interconnect structure 170 formed below the through via structure 108, and in accordance with some embodiments of the disclosure. Next, a conductive connector 176 is formed below the interconnect structure 170, and the package structure 100a is connected to a substrate 180 through the conductive connector 176.

FIG. 1G' shows a cross-sectional representation of a package structure 100b, in accordance with some embodiments of the disclosure. The package structure 100b is similar to, or the same as, the first package structure 100a shown in FIG. 1G, except that no underfill layer is between the semiconductor die 120 and the package layer 160. Processes and materials used to form the package structure 100b may be similar to, or the same as, those used to form the package structure 100a and are not repeated herein. The package layer 160 covers the top surface and the sidewall surfaces of the semiconductor die 120.

Figure 4A:
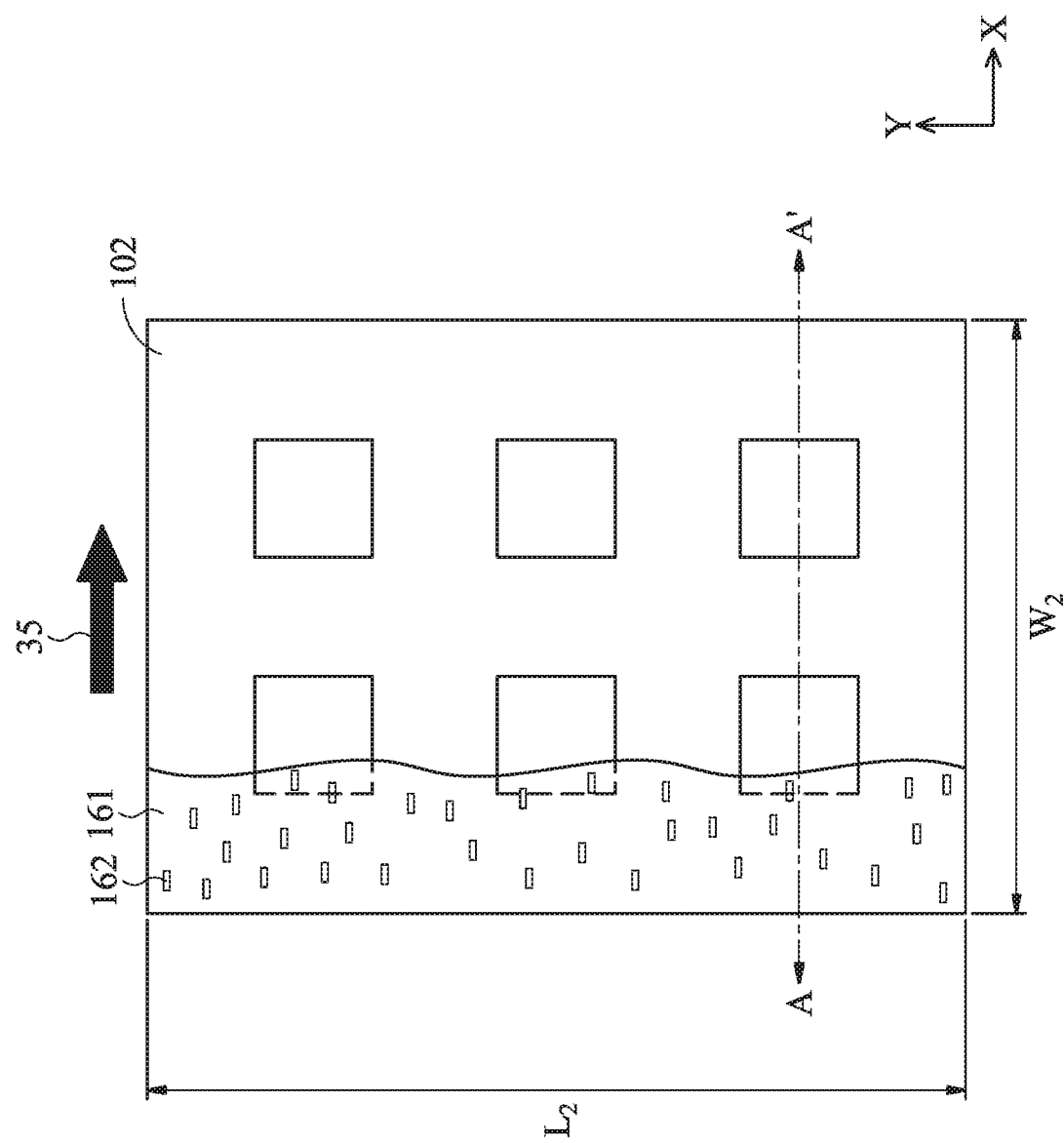
Figure 4B:
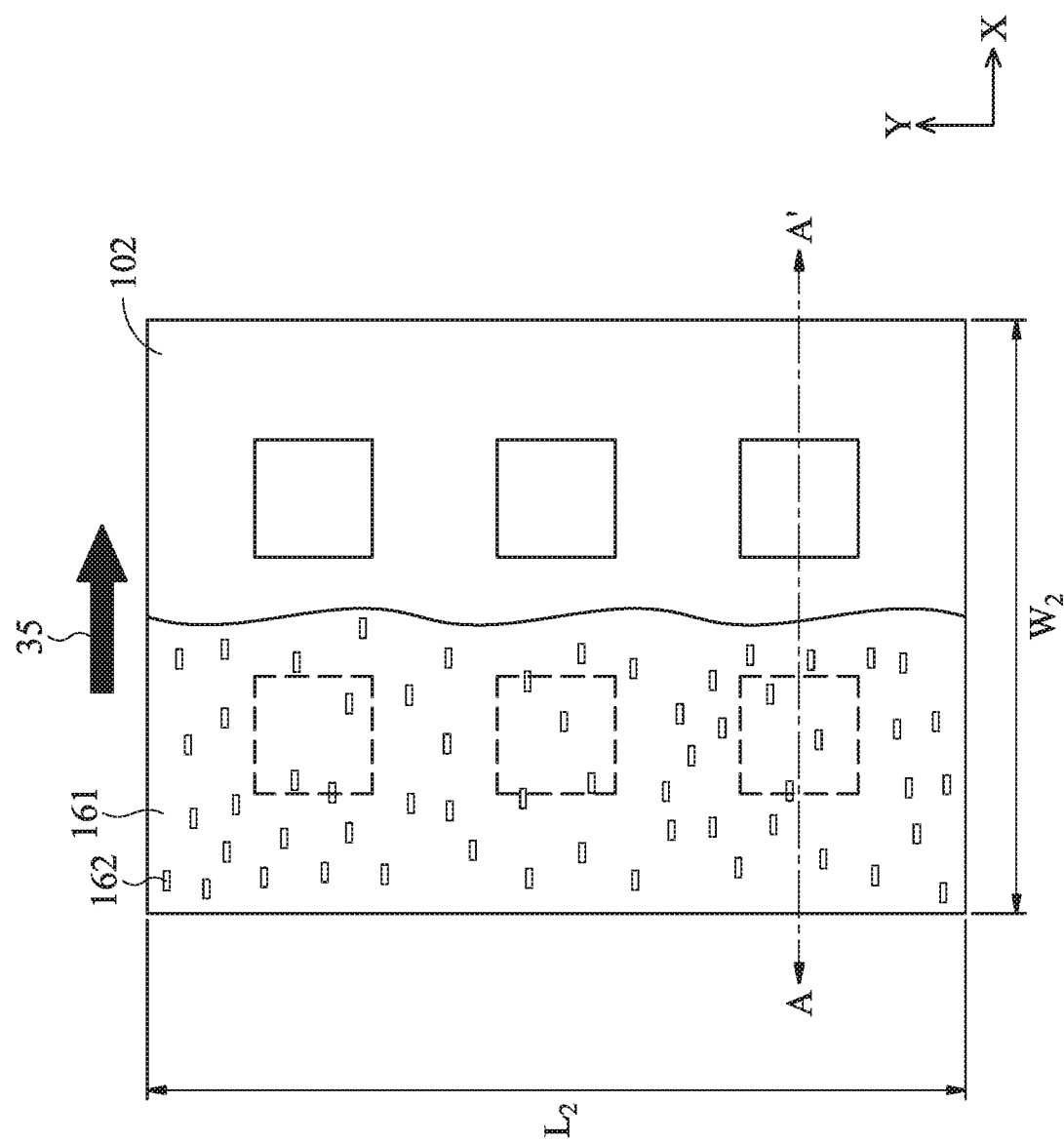

FIGS. 4A-4C show top-view representations of various stages of the flowing of the molding compound material with fillers 162, in accordance with some embodiments of the disclosure. FIG. 3A shows a cross-sectional representation of flow of the molding compound material taken along line A-A' of FIG. 4A.

As shown in FIG. 4A, there are six semiconductor dies 120 formed over the substrate 102. Two semiconductor dies 120 are arranged along the x-axis or horizontal axis in one row, and three semiconductor dies 120 are arranged along the y-axis or vertical axis in one column. The substrate 102 has a second width $W_2$ along the x-axis or horizontal axis, and a second length $L_2$ along the y-axis or vertical axis. The second length $L_2$ is greater than the second width $W_2$. When the molding compound material flows along the x-axis (direction 35), the fillers 162 also flow along the x-axis (direction 35). More specifically, the longitudinal axis of fillers 162 are substantially parallel to the x-axis (direction 35). The molding compound material flows to cover a portion of the exposed surface of the semiconductor dies 120.

Afterwards, as shown in FIG. 4B, half of the semiconductor dies 120 are covered by the molding compound material, in accordance with some embodiments of the disclosure. Similar to FIG. 4A, the longitudinal axis of fillers 162 are substantially parallel to the x-axis (direction 35).

Subsequently, as shown in FIG. 4C, the molding compound material continues to flow along the x-axis (direction 35), in accordance with some embodiments of the disclosure. Half of the second columns of the semiconductor dies 120 are covered by the molding compound material. Similar to FIG. 4B, the longitudinal axis of fillers 162 are substantially parallel to the x-axis (direction 35).

It should be noted that, in some embodiments, when the substrate 102 is bent or wrapped along the x-axis, the flow direction of the molding compound material is controlled to flow along the x-axis to compensate the bending of the substrate 102. The fillers 162 are controlled to flow along the x-axis. The longitudinal axis of fillers 162 is parallel to the x-axis to improve the strength of the package structure 100a in the x-axis. Therefore, the warpage of the package structure 100a is reduced and the reliability of the package structure 100a is improved.

FIGS. 5A-5C show top-view representations of arrangement of the package layer 160, in accordance with some embodiments of the disclosure. After the exposed surfaces of the semiconductor dies 120 are covered by the molding compound material, the substrate 102 is heated by the second heating process to transform the molding compound material into the package layer 160. The package layer 160 includes the polymer 161 and the fillers 162. The fillers 162 are substantially parallel to each other in the package layer 160.

FIG. 5A shows that each of the fillers 162 is parallel to the x-axis (direction 35). FIG. 5B shows that each of the fillers 162 is substantially parallel to the x-axis (direction 35). In FIG. 5B, there is an angle θ between the orientation of filler 162 and the x-axis. In some embodiments, the angle θ is in a range of about 25 degrees to about 30 degrees. In FIG. 5C, in the central region 50 of the package structure 100a (dashed line region), each of the fillers 162 is substantially parallel to the x-axis (direction 35). The central region is defined as the regions covering the locations of the semiconductor dies 120.

Figure 6A:
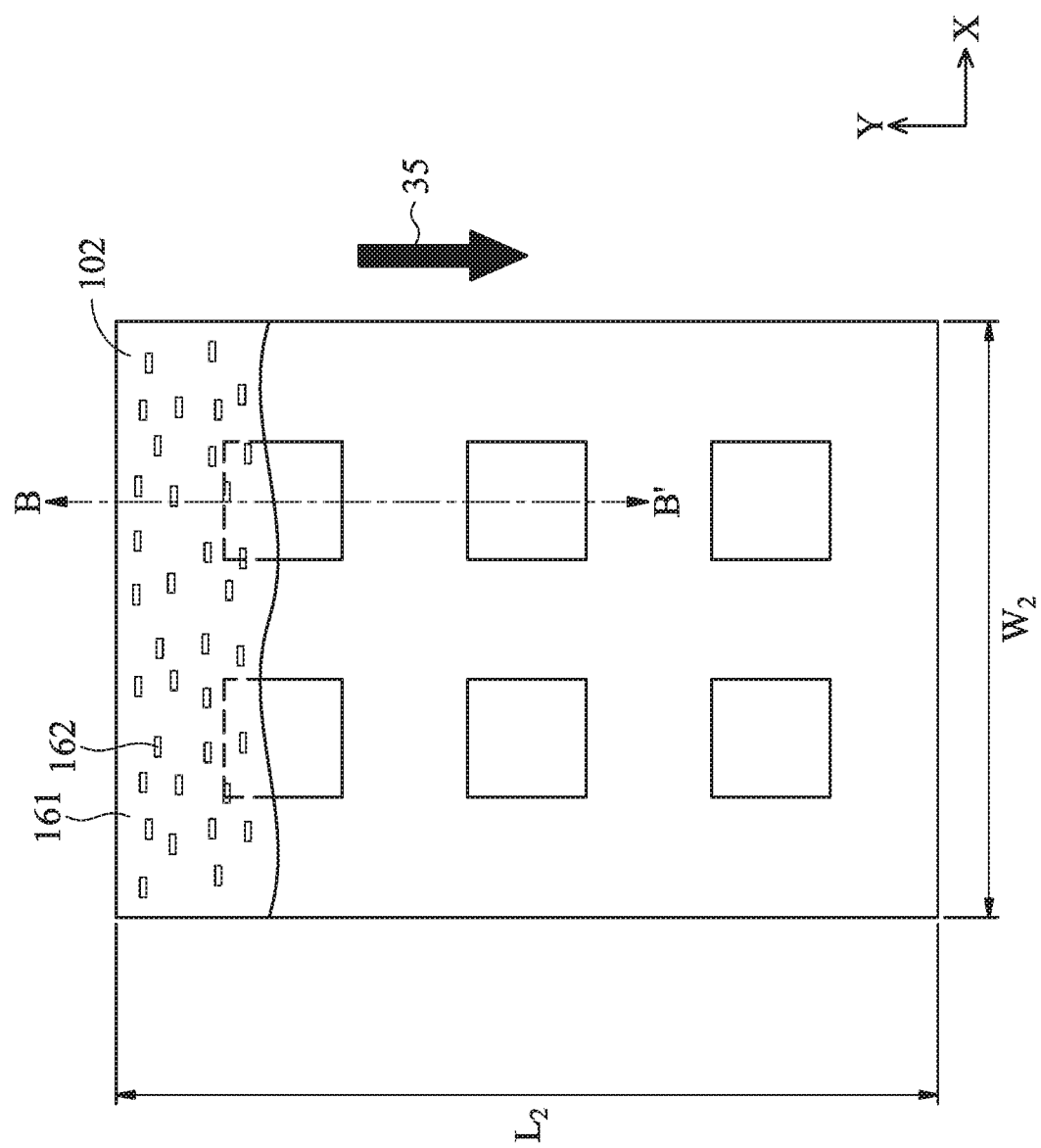
Figure 6C:
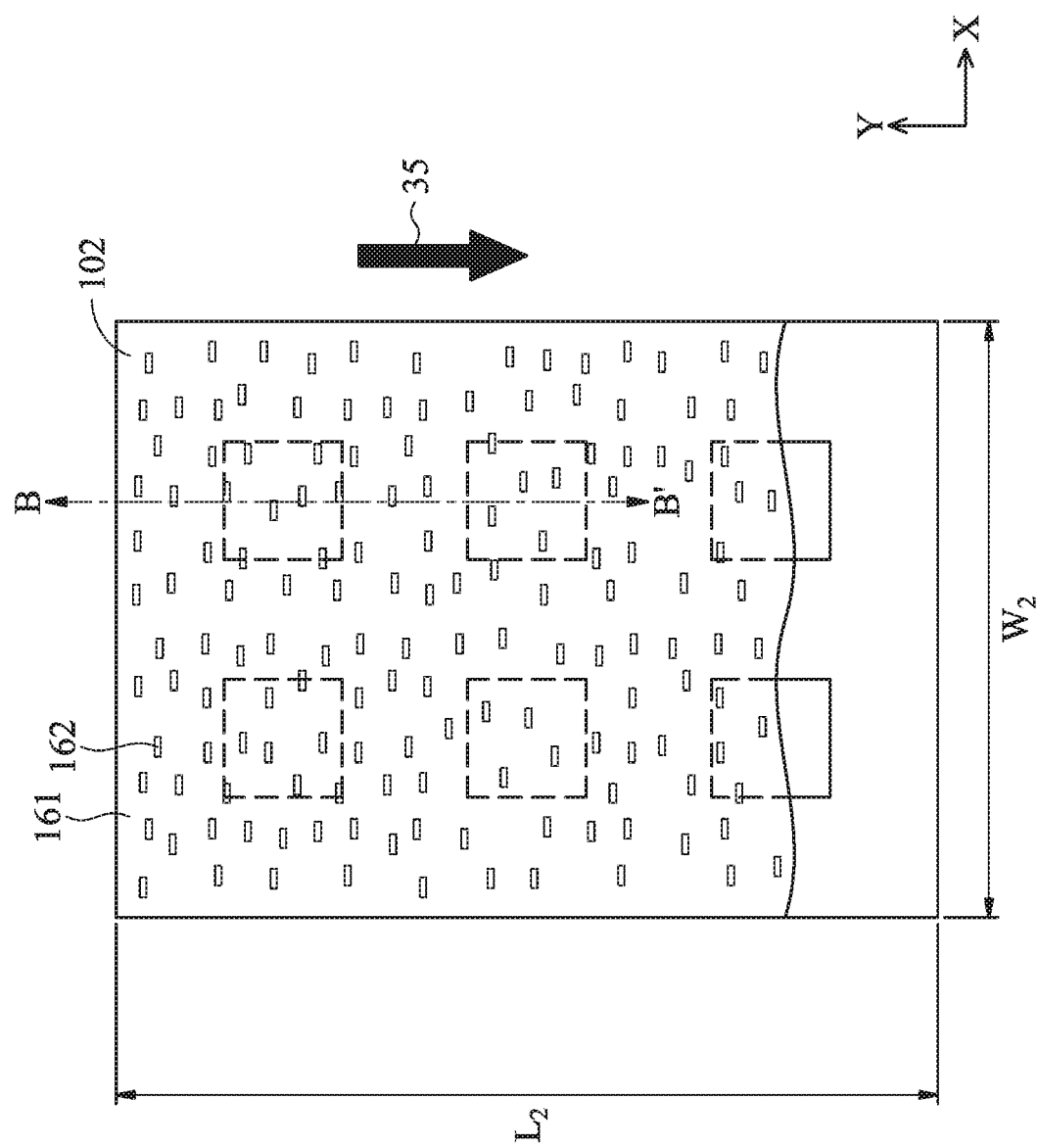

FIGS. 6A-6C show top-view representations of various stages of the flowing of the molding compound material with fillers 162, in accordance with some embodiments of the disclosure. FIG. 3A shows a cross-sectional representation of flow of the molding compound material taken along line B-B' of FIG. 6A.

As shown in FIG. 6A, when the molding compound material flows along the y-axis (vertical direction) (direction 35), the fillers 162 also flow along the y-axis (direction 35). More specifically, the longitudinal axis of fillers 162 are substantially parallel to the y-axis (direction 35). The molding compound material flows to cover a portion of the exposed surface of the semiconductor dies 120.

Afterwards, as shown in FIG. 6B, more than half of the semiconductor dies 120 are covered by the molding compound material, in accordance with some embodiments of the disclosure. Similar to FIG. 6A, the longitudinal axis of fillers 162 are substantially parallel to the y-axis (direction 35).

Subsequently, as shown in FIG. 6C, the molding compound material continues to flow along the y-axis (direction 35), in accordance with some embodiments of the disclosure.

It should be noted that, when the substrate 102 is bended or wrapped along the y-axis, the molding compound material is controlled to flow along the y-axis. The longitudinal axis of fillers 162 is parallel to the y-axis to improve the strength of the package structure 100a in the y-axis. Therefore, the warpage of the package structure 100a is reduced and the reliability of the package structure 100a is improved.

FIGS. 7A-7C show top-view representations of arrangement of the package layer 160, in accordance with some embodiments of the disclosure.

As shown in FIG. 7A, the longitudinal axis of fillers 162 are substantially parallel to the y-axis (direction 35).

As shown in FIG. 7B, each of the fillers 162 is substantially parallel to the x-axis (direction 35). More specifically, there is an angle θ between the orientation of filler 162 and the y-axis. In some embodiments, the angle θ is in a range of about 25 degrees to about 30 degrees. In FIG. 7C, in the central region 50 of the package structure 100a (dashed line region), each of the fillers 162 is substantially parallel to the x-axis (direction 35). The central region is defined as the regions covering the locations of the semiconductor dies 120.

Since the fillers 162 of the package layer 160 have cylindrical-shaped or strip-shaped structures, the anisotropic fillers 162 have directionality. The longitudinal axis of the fillers 162 are parallel to the flow of the direction. Therefore, the strength of the package layer 160 along the y-axis is improved, and the warpage of the package structure 100a is reduced.

In some embodiments, the longitudinal axis of the fillers 162 are parallel to the second width $W_2$ of the substrate 102. In some other embodiments, the longitudinal axis of the fillers 162 are parallel to the second length $L_2$ of the substrate 102. The isotropic fillers 162 can reduce the warpage of the package structure 100a.

FIGS. 8A-8F show cross-sectional representations of various stages of forming a package structure 100c, in accordance with some embodiments of the disclosure.

Figure 8A:
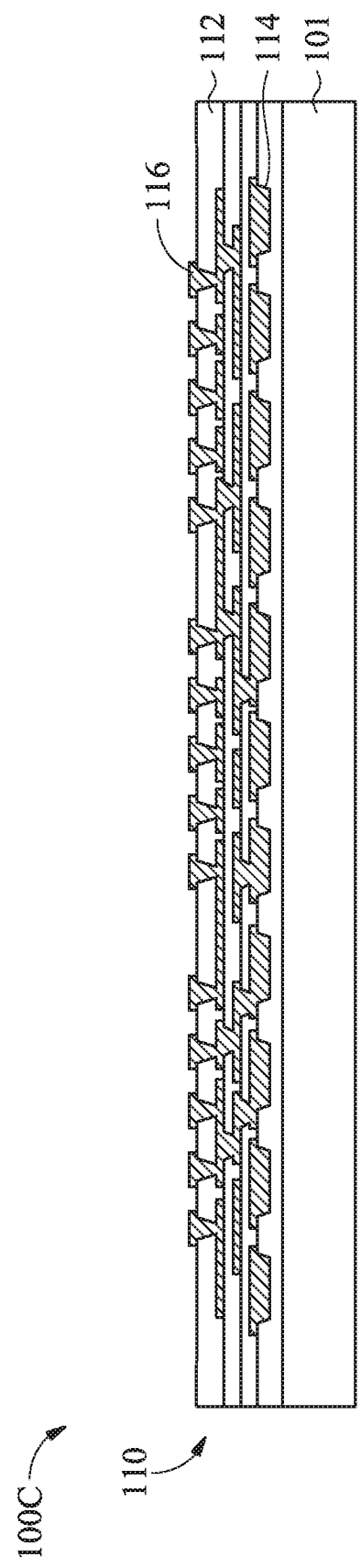
FIGS. 8A-8F show cross-sectional representations of various stages of forming a package structure, in accordance with some embodiments of the disclosure.

As shown in FIG. 8A, a carrier substrate 101 is provided. The carrier substrate 101 is configured to provide temporary mechanical and structural support during subsequent steps of the process, in accordance with some embodiments. The carrier substrate 101 includes glass, silicon oxide, aluminum oxide, metal, a combination thereof, and/or the like, in accordance with some embodiments. The carrier substrate 101 includes a metal frame, in accordance with some embodiments.

The interconnect structure 110 is formed over the carrier substrate 101. The interconnect structure 110 includes multiple conductive layers 114 and conductive pads 116 formed in multiple dielectric layers 112.

Figure 8B:
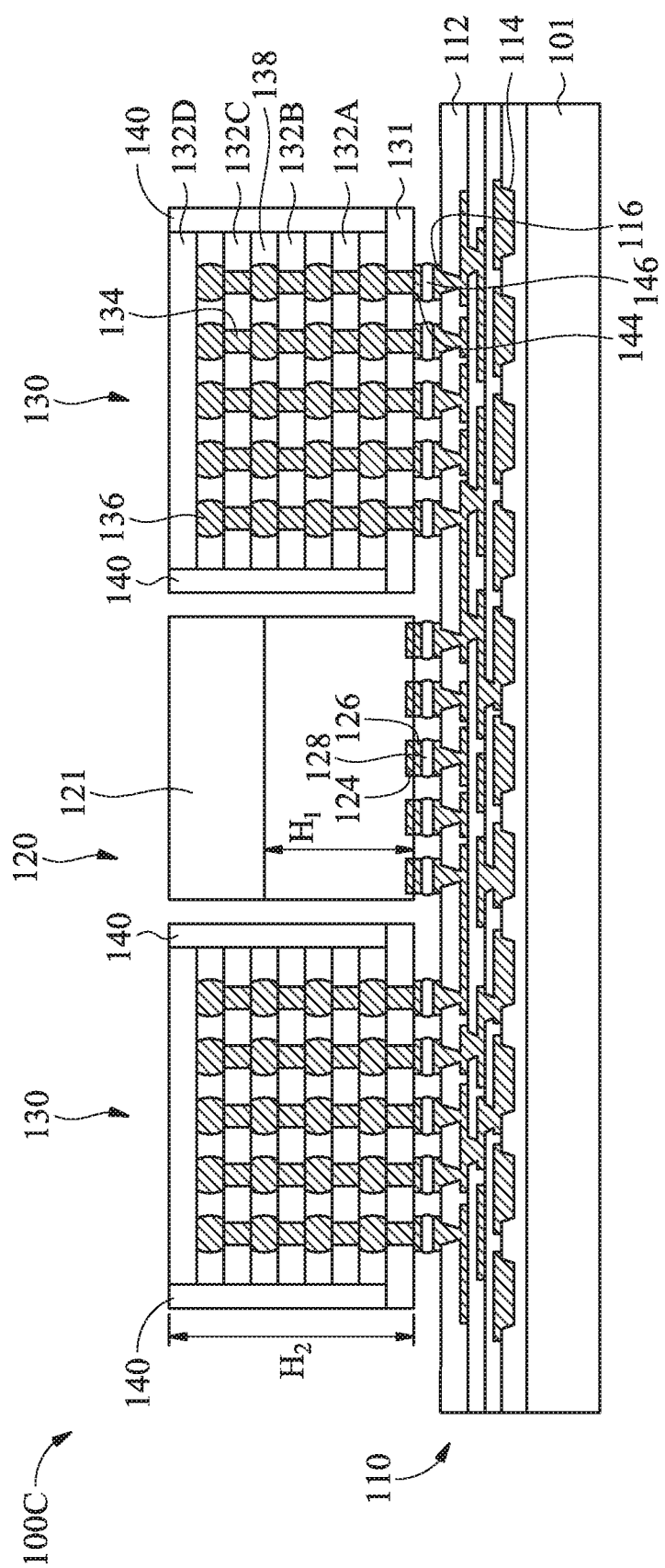

Next, as shown in FIG. 8B, a semiconductor die 120, a first stacked die package structure 130a and a second stacked die package structure 130b are formed over the carrier substrate 102, in accordance with some embodiments of the disclosure. The semiconductor die 120 is between the first stacked die package structure 130a and the second stacked die package structure 130b.

The semiconductor die 120 has a substrate 121. In some embodiments, a number of conductive pads 126 are formed below the conductive layers 124 of the semiconductor die 120, and each of the conductive pads 126 is bonded to each of the conductive pads 116 through a number of conductive connectors 128.

The first stacked die package structure 130a and the second stacked die package structure 130b are disposed over the interconnect structure 110. The first stacked die package structure 130a and the second stacked die package structure 130b are at opposite sides of the semiconductor die 120. The first stacked die package structure 130a and the second stacked die package structure 130b each includes a number of semiconductor dies 132A, 132B, 132C, 132D. In some embodiments, the semiconductor dies 132A, 132B, 132C, 132D are memory dies.

The semiconductor die 120 has a different function than each of the memory dies. The memory dies may include static random access memory (SRAM) devices, dynamic random access memory (DRAM) devices, high bandwidth memory (HBM) or other memory dies. The number of semiconductor dies 132A, 132B, 132C, 132D is not limited to four, and the number can be adjusted according to need.

The semiconductor dies 132A, 132B, 132C, 132D are stacked on a buffer die (or base die) 131 that performs as a logic circuit. The semiconductor dies 132A, 132B, 132C, 132D are bonded to each other by a number of bonding structures 136. A number of through substrate vias (TSVs) 134 are formed in the semiconductor dies 132A, 132B, 132C, 132D. The signal between the semiconductor dies 132A, 132B, 132C, 132D may be transferred through the through substrate vias (TSVs) 134 and the bonding structures 136.

An underfill layer 138 is formed between the semiconductor dies 132A, 132B, 132C, 132D to protect the bonding structures 136. In some embodiments, the underfill layer 138 includes an epoxy-based resin with fillers dispersed therein.

A molding compound 140 protects the semiconductor dies 132A, 132B, 132C, 132D. In some embodiments, the molding compound 140 may include an epoxy-based resin with fillers dispersed therein. In some embodiments, the average diameter of the spherical fillers dispersed in the underfill layer 138 is shorter than those dispersed in the molding compound 140.

Figure 8C:
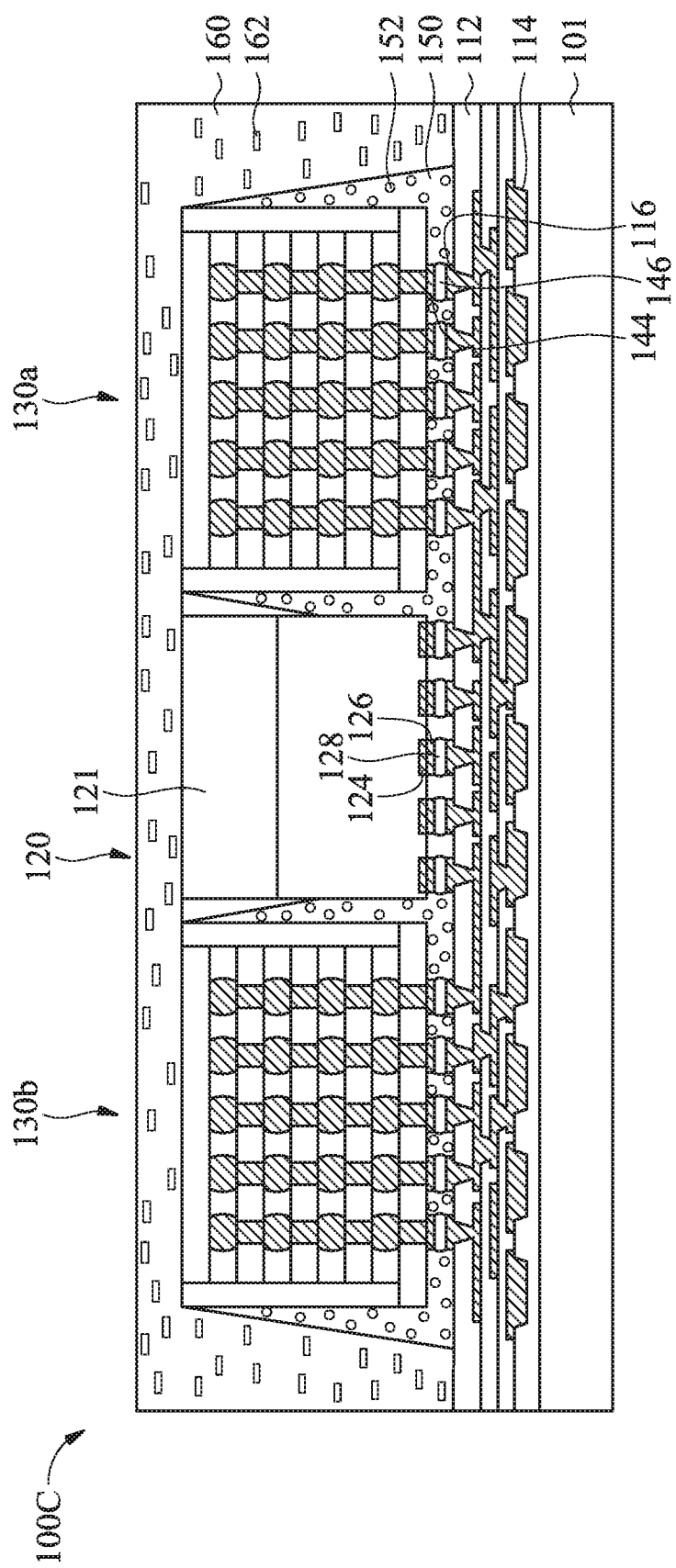

Afterwards, as shown in FIG. 8C, an underfill layer 150 is formed between the semiconductor die 120 and the interconnect structure 110, in accordance with some embodiments of the disclosure. The underfill layer 150 includes fillers 152 with spherical structures. The underfill layer 150 surrounds and protects the conductive connectors 128. In some embodiments, the underfill layer 150 is in direct contact with the conductive connectors 128. The underfill layer 150 in FIG. 8C is similar to, or the same as, the underfill layer 150 in FIG. 1G and are not repeated herein.

Next, the package layer 160 is formed over the underfill layer 150. The package layer 160 in FIG. 8C is similar to, or the same as, the package layer 160 in FIG. 1G and are not repeated herein. The package layer 160 includes the fillers 162, and the fillers 162 have asymmetric structure. The fillers 162 are between the first semiconductor die 120, the first stacked die package structure 130a and the second stacked die package structure 130b.

In some embodiments, the average diameter of each of the fillers 152 of the underfill layer 150 is shorter than the average first length $L_1$ of each of the first fillers 162 of the package layer 160. In some embodiments, the coefficient of thermal expansion (CTE) of each of the fillers 162 of the package layer 160 is greater than the CTE of each of the fillers 152 of the underfill layer 150. In some other embodiments, the average diameter of the spherical fillers dispersed in the underfill layer 138 is shorter than the average first length $L_1$ of each of the first fillers 162 of the package layer 160.

Figure 8D:
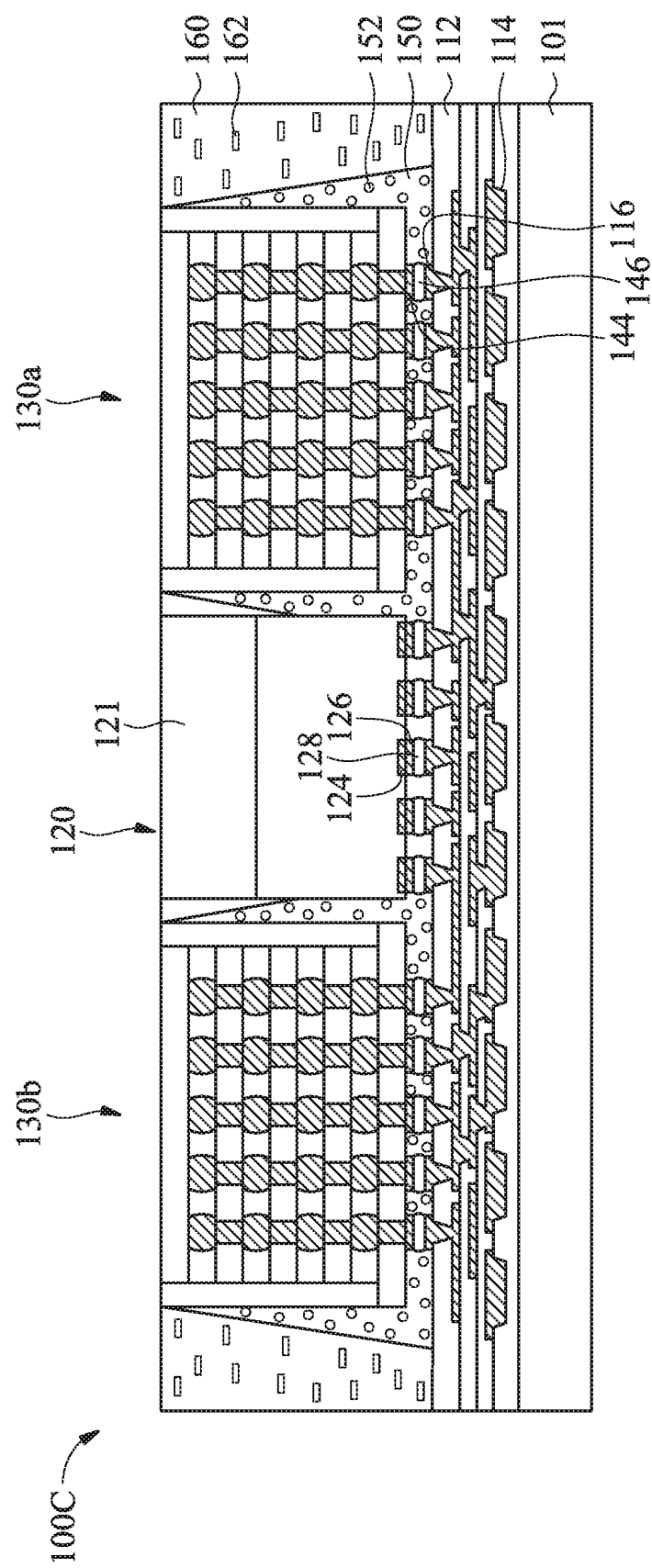

Afterwards, as shown in FIG. 8D, a portion of the package layer 160 is removed, in accordance with some embodiments of the disclosure. As a result, the top surface of the first stacked die package structure 130a and the top surface of the second stacked die package structure 130b are exposed. In some embodiments, the no-functional region is removed, and thus the function of the semiconductor dies 132A, 132B, 132C and 132D are maintained.

Figure 8E:
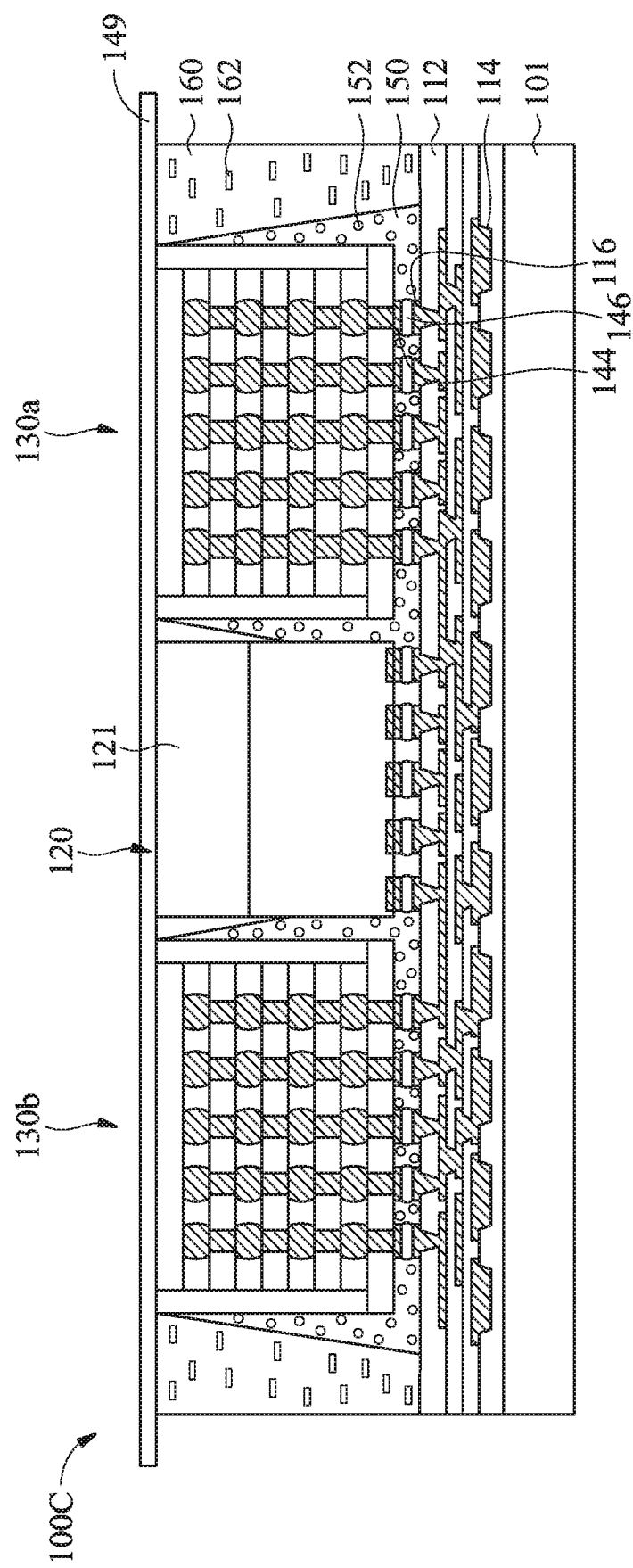

Next, as shown in FIG. 8E, the exposed top surface of the first stacked die package structure 130a and the exposed top surface of the second stacked die package structure 130b are attached to a frame tape 149, in accordance with some embodiments of the disclosure. Afterwards, the carrier substrate 101 is removed.

Figure 8F:
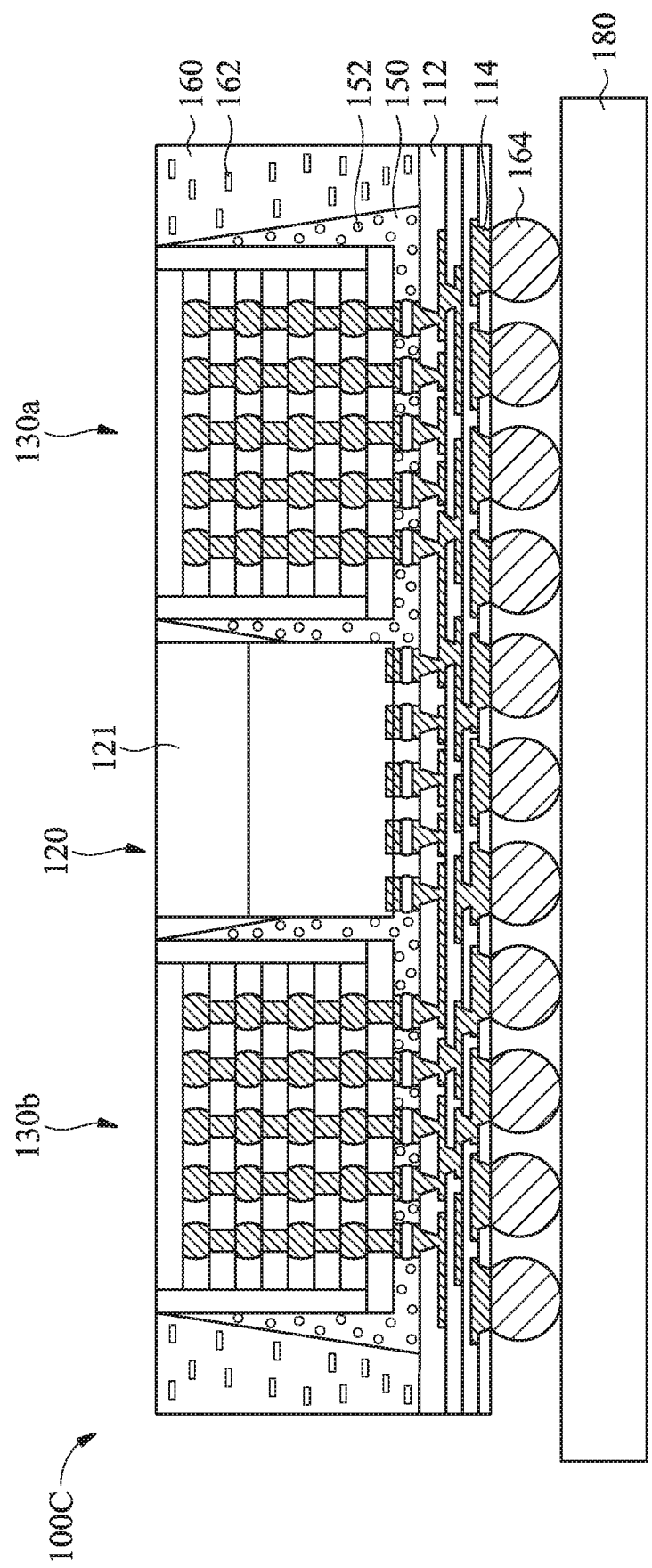

Subsequently, as shown in FIG. 8F, a portion of the interconnect structure 110 is removed to expose the conductive layer 106, in accordance with some embodiments of the disclosure. Next, a number of conductive connectors 164 are formed over the exposed conductive layer 106 of the interconnect structure 110. The conductive connectors 164 are electrically connected to the conductive layer 106 of the interconnect structure 110. In some embodiments, the conductive connectors 164 are referred to as controlled collapse chip connection (C4) bumps.

Next, a singulation process is performed to separate the wafer-level package structure 100c into multiple die-level package structure 100c. In some embodiments, the singulation process is a dicing process. The package structure 100c is bonded to a package substrate 180 through the conductive connectors 164. In some embodiments, the package substrate 180 is a printed circuit board (PCB).

FIGS. 9A-9G show cross-sectional representations of various stages of forming a package structure 100d, in accordance with some embodiments of the disclosure. Processes and materials used to form the package structure 100d may be similar to, or the same as, those used to form the package structure 100c and are not repeated herein.

Figure 9A:
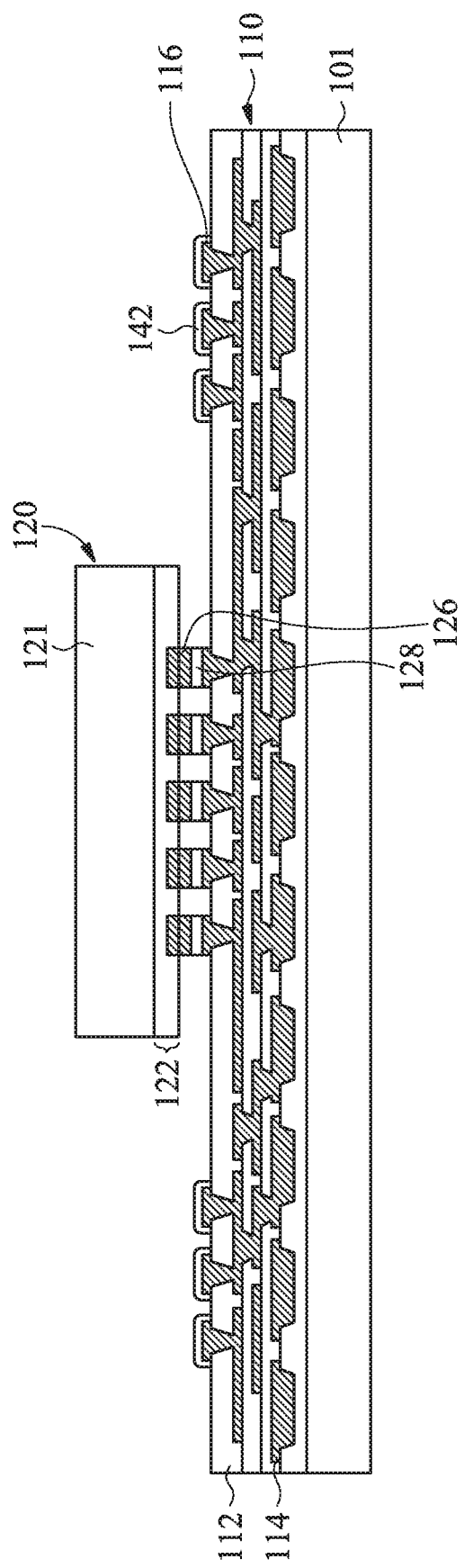
FIGS. 9A-9G show cross-sectional representations of various stages of forming a package structure, in accordance with some embodiments of the disclosure.

As shown in FIG. 9A, the interconnect structure 110 is formed over the carrier substrate 101, and the semiconductor die 120 is formed over the interconnect structure 110. In some embodiments, a number of conductive pads 126 are formed below the conductive layers 124 of the semiconductor die 120, and each of the conductive pads 126 is bonded to each of the conductive pads 116 through a number of conductive connectors 128.

Figure 9B:
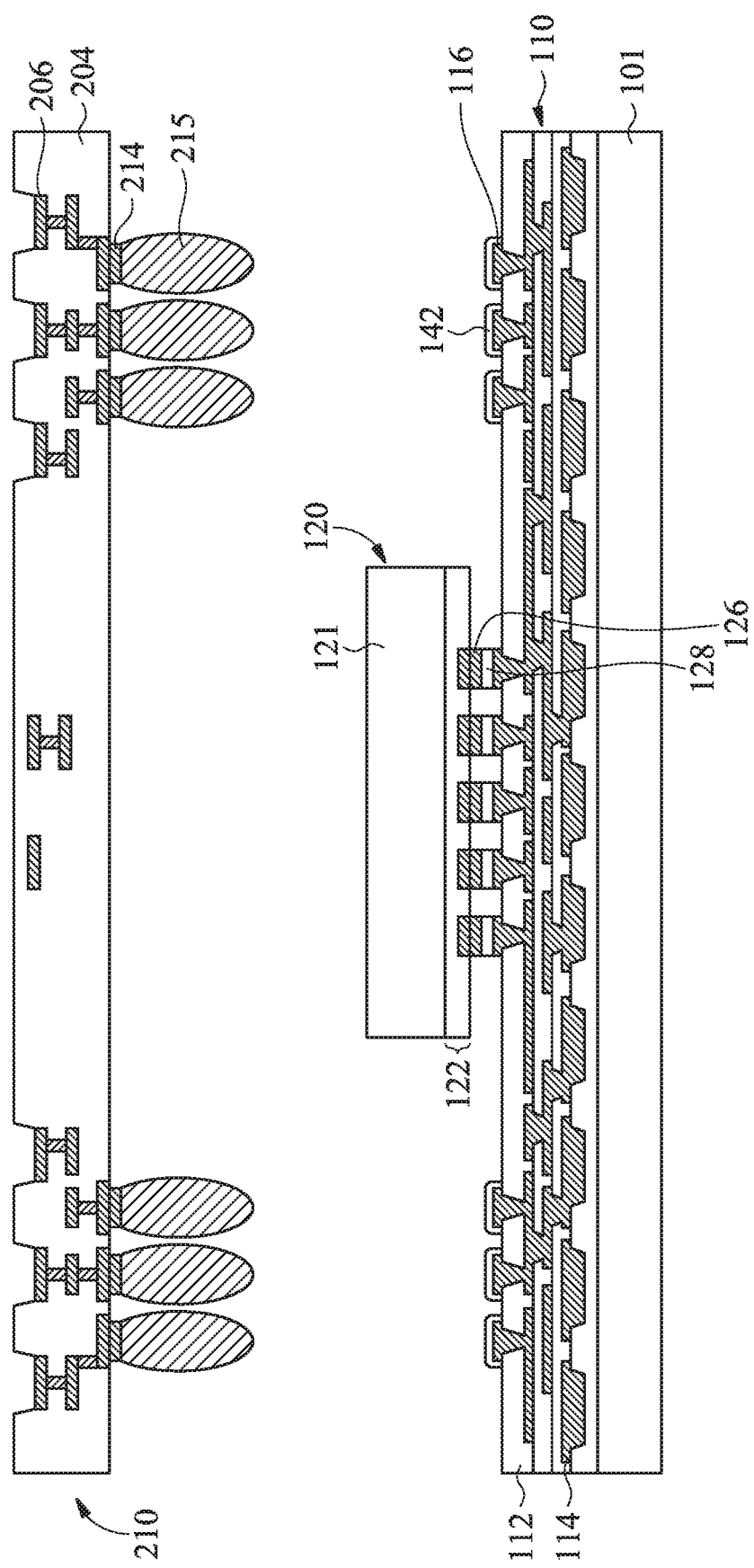

Next, as shown in FIG. 9B, a flux 142 is dispersed on the conductive pads 116, and a second interconnect structure 210 is disposed over the semiconductor die 120, in accordance with some embodiments of the disclosure. A number of conductive pads 214 are formed below the second interconnect structure 210. A number of conductive connectors 215 are formed over the conductive pads 214.

The second interconnect structure 210 includes multiple dielectric layers 204 and multiple conductive layers 206. The materials and manufacturing method for forming the multiple dielectric layers 204 and multiple conductive layers 206 are the same as, or similar to, the materials and manufacturing method for forming the multiple dielectric layers 112 and multiple conductive layers 114, and therefore the descriptions thereof are omitted for brevity.

Figure 9C:
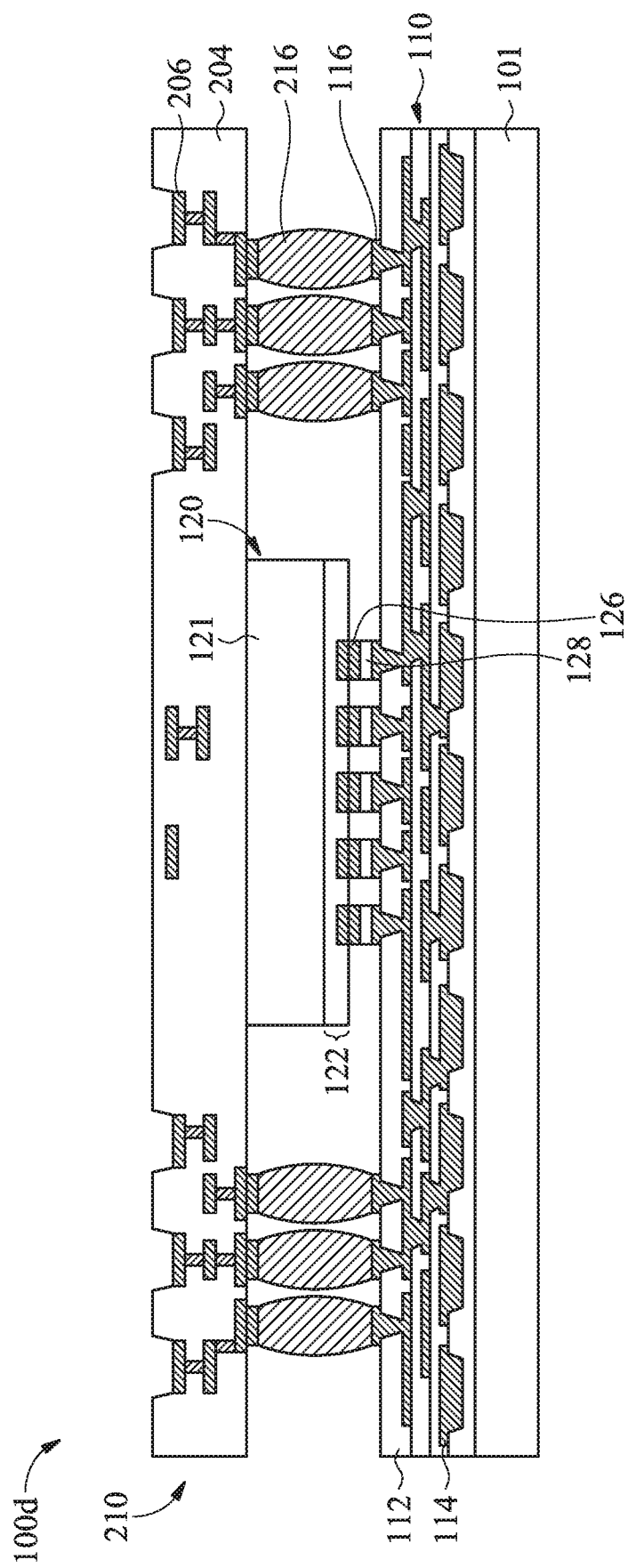

Subsequently, as shown in FIG. 9C, the second interconnect structure 210 is bonded to the first interconnect structure 110 by bonding the conductive connector 215 to the flux 142 to form a conductive connector 216 (or joint connector), in accordance with some embodiments of the disclosure. A cavity 147 is formed between the first interconnect structure 110 and the second interconnect structure 210. The conductive layer 206 of the second interconnect structure 210 is electrically connected to the conducive layer 106 of the first interconnect structure 110 by the conductive connector 216.

Figure 9D:
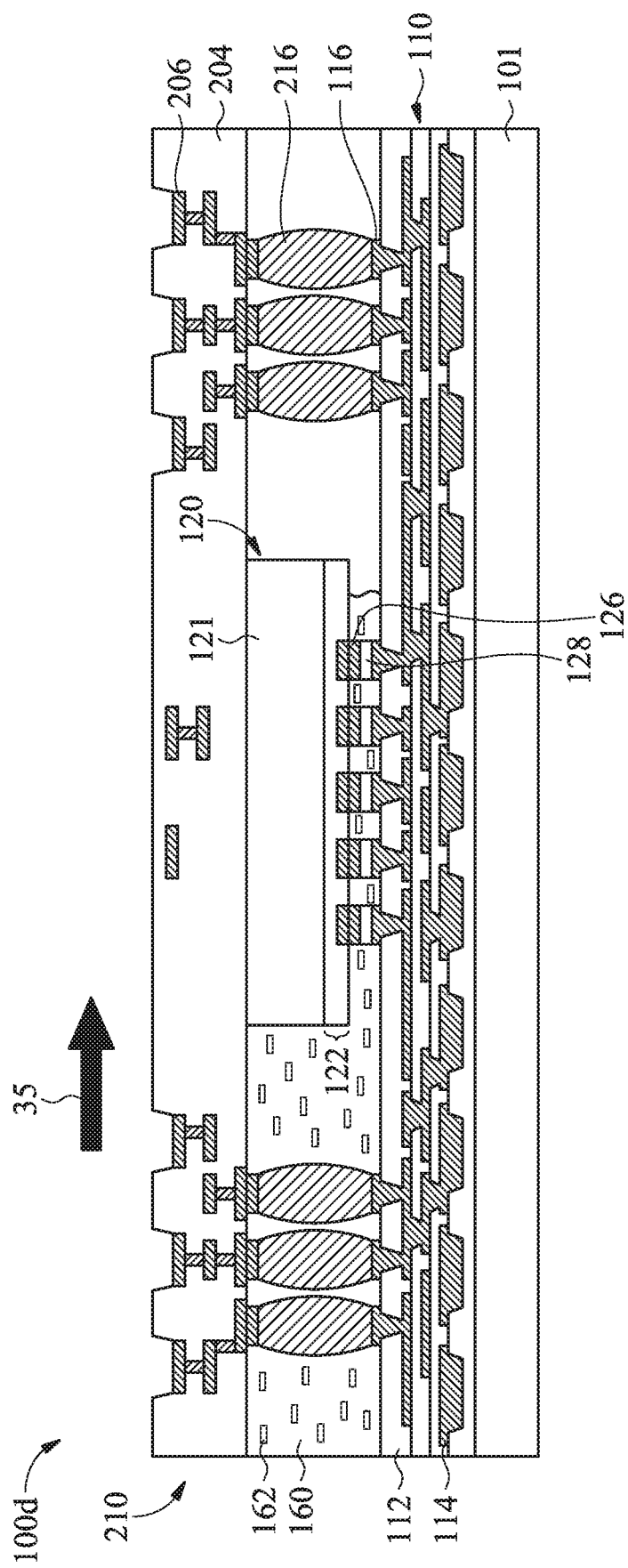

Afterwards, as shown in FIG. 9D, the molding compound material flows from a first side of the semiconductor die 120, in accordance with some embodiments of the disclosure. The molding compound material surrounds and protects the conductive connector 216.

Figure 9E:
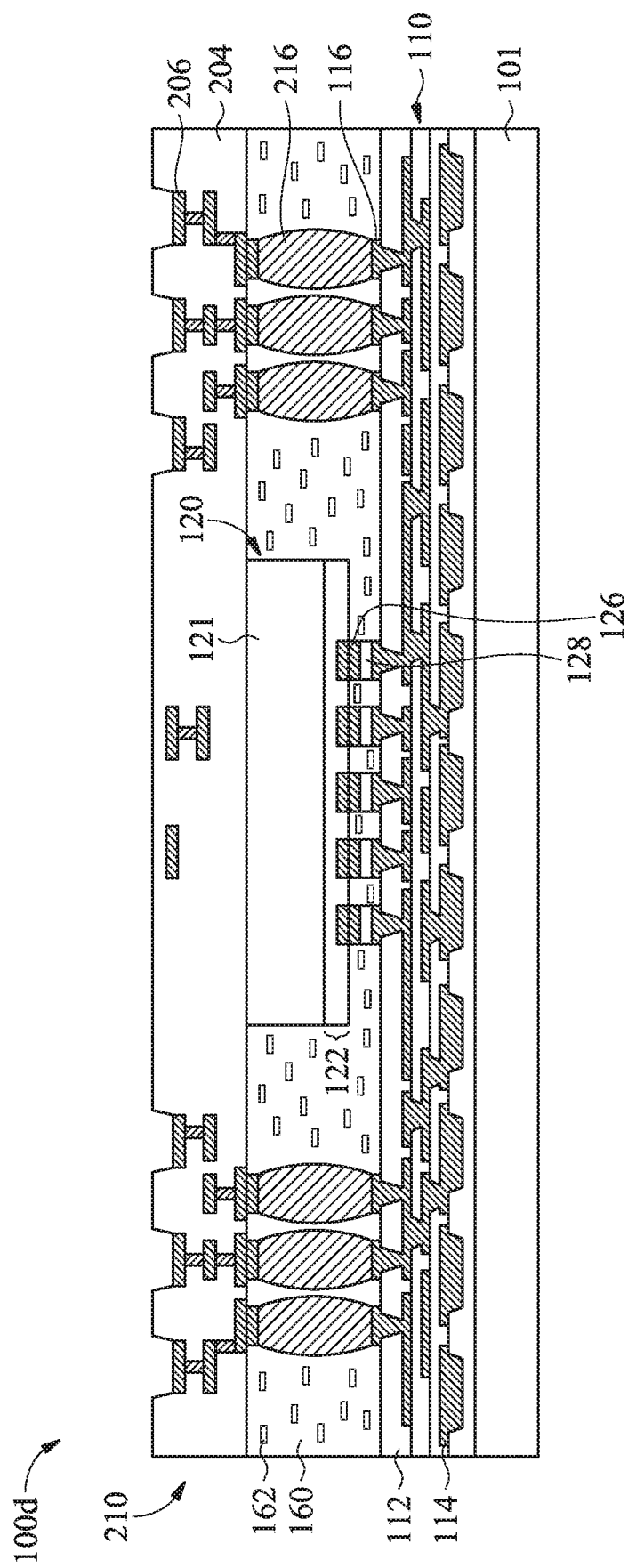

Next, as shown in FIG. 9E, the cavity 147 is filled with the molding compound material, and the molding compound is cured to form the package layer 160, in accordance with some embodiments of the disclosure. The package layer 160 in FIG. 9E is similar to, or the same as, the package layer in FIG. 1G and are not repeated herein. The fillers 162 are between the semiconductor die 120 and the interconnect structure 110. In addition, the fillers 162 are between two adjacent conductive connectors 128.

The fillers 162 have a first length $L_1$ along a longitudinal axis and a first width $W_1$ along a transverse direction, and the first length $L_1$ is greater than the first width $W_1$ (as shown in FIGS. 2B-2D). The fillers 162 are between the conductive connectors 216. The longitudinal axis of the filler 162 of the package layer 160 is perpendicular to the extended direction of the conductive connector 216.

Figure 9F:
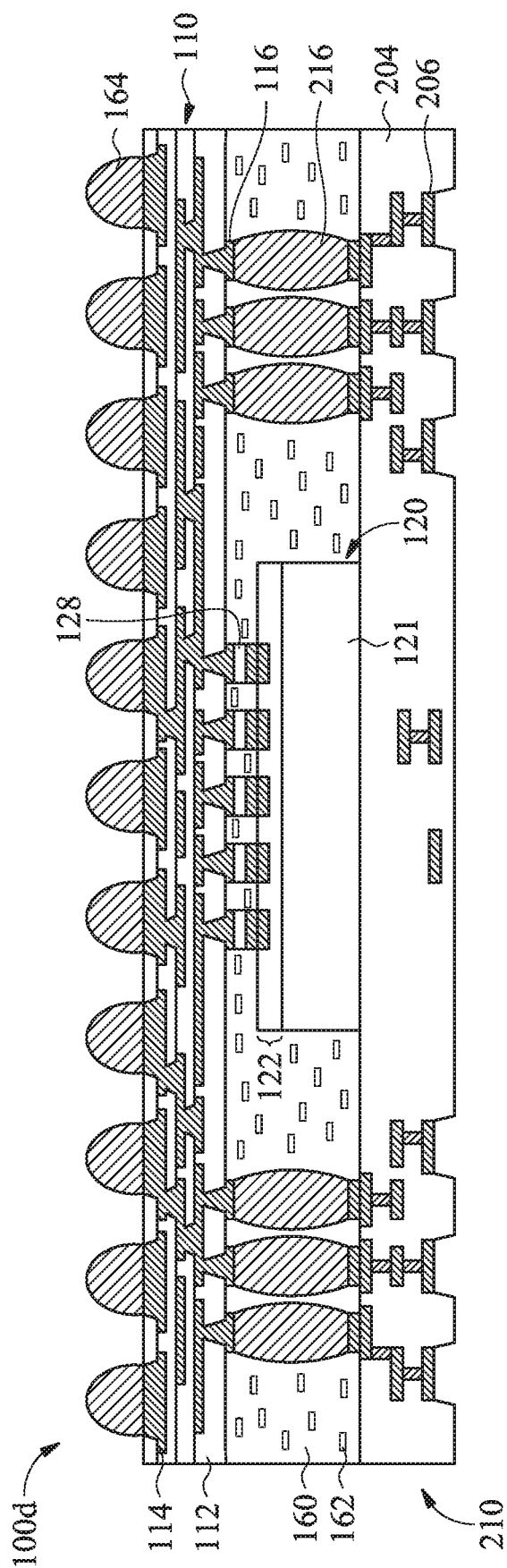

Next, as shown in FIG. 9F, the semiconductor die 120 is turned upside down and the carrier substrate 101 is removed, and a portion of the first interconnect structure 110 is removed, in accordance with some embodiments of the disclosure. Afterwards, a number of conductive connectors 164 are formed over the exposed conductive layer 106 of the first interconnect structure 110.

Figure 9G:
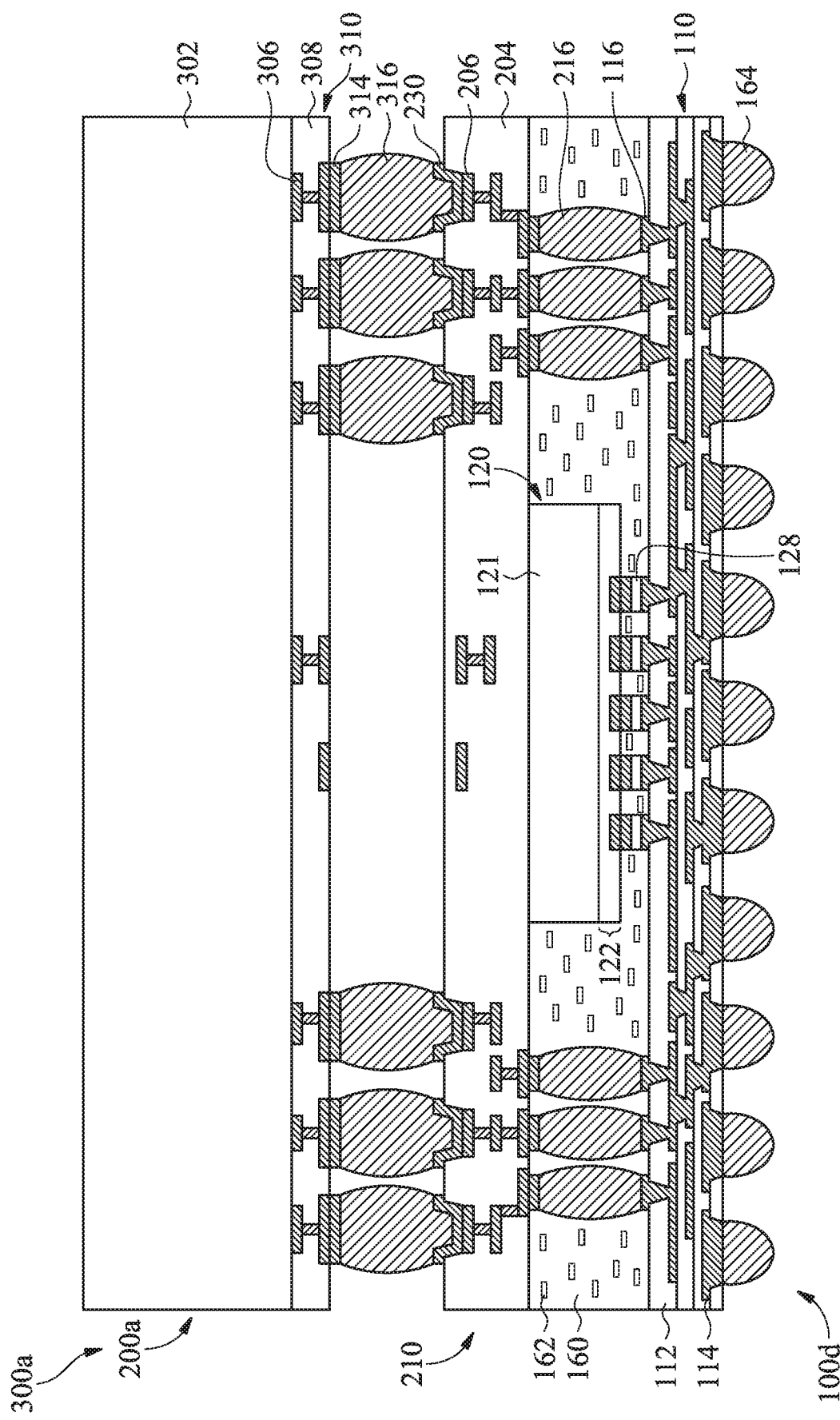

Afterwards, as shown in FIG. 9G, the first package structure 100d is turned upside down and a second package structure 200a is formed over the second interconnect structure 210, in accordance with some embodiments of the disclosure. As a result, a package structure 300a including the first package structure 100d and the second package structure 200a is obtained.

An under bump metallization (UBM) layer 230 is formed over the conductive layer 206 of the second interconnect structure 210. The second package structure 200a includes the second die structure 302 and a third interconnect structure 310 below the second die structure 302. The third interconnect structure 310 includes multiple dielectric layers 308 and multiple conductive layers 306 formed in the dielectric layers 308.

A conductive pad 314 is formed below the third interconnect structure 310, and a conductive connector 316 is formed on the conductive pad 314. The second package structure 200a is boned to the first package structure 100d by the conductive connector 316. The conductive connector 316 is between the conductive pad 314 and the UBM layer 230.

In some embodiments, the second die structure 302 includes a static random access memory (SRAM) device, a dynamic random access memory (DRAM) device, a high bandwidth memory (HBM) device or another memory device.

The package layer 160 of the package structure 100a, 100b, 100c and 100d has the fillers 162 with cylindrical-shaped or strip-shaped structure. Since the fillers 162 do not have spherical structure, and anisotropic fillers 162 of the package layer 160 have directionality. The fillers 162 in the package layer 160 have directionality, and the longitudinal axis of the filler 162 flows along the flow direction of the molding compound material. As a result, the strength of the package layer 160 along the flow direction is improved, and therefore the warpage of the package structures 100a, 100b, 100c and 100d is reduced.

Embodiments of methods for forming a package structure are provided. A die is formed over a substrate, and a molding compound material is injected to flow from a first side of the die to a second side of the die. The molding compound material includes fillers in the polymer. Each of the fillers has the first length along a longitudinal axis and a first width along a transverse direction, and the first length is greater than the first width. Afterwards, the molding compound material is heated to form the package layer. Since the fillers have strip cylindrical-shaped or strip-shaped structure, the longitudinal axis of the filler flows along the flow direction of the molding compound material. In addition, since the anisotropic fillers have directionality, the strength of the package layer along the flow direction is improved. Therefore, the quality and reliability of the package structure are improved.

In some embodiments, a method for forming a package structure is provided. The method includes forming a first die over a first substrate, and injecting a molding compound material from a first side of the first die to a second side of the first die. The molding compound material includes a plurality of first fillers, each of the first fillers has a length along a longitudinal axis and a width along a transverse direction, and the length is greater than the width. The method further includes heating the molding compound material to form a package layer over the first die, and the first fillers are substantially parallel to each other.

In some embodiments, a method for forming a package structure is provided. The method includes forming a first die over a first substrate, and providing a transfer molding apparatus. The transfer molding apparatus includes a first mold portion, a second mold portion and a mold cavity between the first mold portion and the second mold portion. The method also includes disposing the first substrate between the first mold portion and the second mold portion, and filling a molding compound material into the mold cavity. The molding compound material includes a plurality of first fillers, and each of the first fillers has a length along a longitudinal axis and a width along a transverse direction, and wherein the molding compound material flows in a direction. The longitudinal axis of each of the first fillers is substantially parallel to the direction. The method includes curing the molding compound material to form a package layer over the first die.

In some embodiments, a method for forming a package structure is provided. The method includes forming a die over a first interconnect structure, and forming a second interconnect structure over the die. There is a cavity between the first interconnect structure and the second interconnect structure. The method also includes injecting a molding compound material into the cavity. The molding compound material includes a plurality of fillers, and each of the fillers has a length along a longitudinal axis and a width along a transverse direction, the length is greater than the width, the filler flows in a direction, and the longitudinal axis of each of the first fillers is substantially parallel to the direction. The method further includes curing the molding compound material to form a package layer over the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
   forming a first die over a first substrate;
   injecting a molding compound material from a first side of the first die to a second side of the first die, wherein the molding compound material comprises a plurality of first fillers, each of the first fillers has a length along a longitudinal axis and a width along a transverse direction, and the length is greater than the width; and
   heating the molding compound material to form a package layer over the first die, wherein the first fillers are substantially parallel to each other.

2. The method for forming the package structure as claimed in claim 1, further comprising:
   forming an underfill layer over the substrate, wherein the underfill layer is between the first die and the package layer, the underfill layer comprises a plurality of second fillers, and the second fillers have spherical-shaped structures.

3. The method for forming the package structure as claimed in claim 2, wherein an average diameter of each of the second fillers is shorter than an average length of each of the first fillers.

4. The method for forming the package structure as claimed in claim 2, wherein a coefficient of thermal expansion (CTE) of each of the first fillers is greater than a CTE of each of the second fillers.

5. The method for forming the package structure as claimed in claim 1, further comprising:
   a plurality of conductive connectors adjacent to the first die, wherein the first fillers are between two adjacent conductive connectors, and the longitudinal axis of the first filler is perpendicular to an extended direction of the conductive connectors.

6. The method for forming the package structure as claimed in claim 1, further comprising:
   providing a transfer molding apparatus, wherein the transfer molding apparatus comprises a first mold portion, a second mold portion and a mold cavity between the first mold portion and the second mold portion;
   disposing the substrate in the mold cavity;
   injecting the molding compound material into the mold cavity, wherein the molding compound material flows in a direction, wherein the longitudinal axis of each of the first fillers is substantially parallel to the direction.

7. The method for forming the package structure as claimed in claim 1, wherein the first fillers have a weight percentage in the package layer that is in a range from about 60% to about 70%.

8. The method for forming the package structure as claimed in claim 1, wherein each of the first fillers has a cylindrical-shaped or strip-shaped structure.

9. The method for forming the package structure as claimed in claim 1, further comprising:
   forming a second die over the substrate, wherein the second die comprises a plurality of memory dies, the first die has a different function than each of the memory dies, and the first fillers are between the first die and the second die.

10. A method for forming a package structure, comprising:
    forming a first die over a first substrate;
    providing a transfer molding apparatus, wherein the transfer molding apparatus comprises a first mold portion, a second mold portion and a mold cavity between the first mold portion and the second mold portion;

disposing the first substrate between the first mold portion and the second mold portion;

filling a molding compound material into the mold cavity, wherein the molding compound material comprises a plurality of first fillers, and each of the first fillers has a length along a longitudinal axis and a width along a transverse direction, and wherein the molding compound material flows in a direction, wherein the longitudinal axis of each of the first fillers is substantially parallel to the direction; and curing the molding compound material to form a package layer over the first die.

11. The method for forming the package structure as claimed in claim 10, further comprising:

forming a second die over the substrate, wherein the second die comprises a plurality of memory dies, and the first fillers are between the first die and the second die.

12. The method for forming the package structure as claimed in claim 10, further comprising:

a plurality second fillers formed in two adjacent memory dies, wherein an average diameter of each of the second fillers is shorter than an average length of each of the first fillers.

13. The method for forming the package structure as claimed in claim 10, wherein each of the first fillers has an aspect ratio that is in a range from about 1.05 to about 5.

14. The method for forming the package structure as claimed in claim 10, further comprising:

performing a first heating process on the substrate while filling the molding compound material into the mold cavity, wherein the first heating process operates at a first temperature; and performing a second heating process on the substrate while curing the molding compound material, wherein the second heating process operates at a second temperature, and the second temperature is greater than the first temperature.

15. The method for forming the package structure as claimed in claim 10, wherein the molding compound material further comprises a polymer, and a coefficient of thermal expansion (CTE) of the polymer is greater than a CTE of each of the first fillers.

16. A method for forming a package structure, comprising:

forming a die over a first interconnect structure;

forming a second interconnect structure over the die, wherein there is a cavity between the first interconnect structure and the second interconnect structure;

injecting a molding compound material into the cavity, wherein the molding compound material comprises a plurality of fillers, and each of the fillers has a length along a longitudinal axis and a width along a transverse direction, the length is greater than the width, the filler flows in a direction, and the longitudinal axis of each of the first fillers is substantially parallel to the direction; and curing the molding compound material to form a package layer over the die.

17. The method for forming the package structure as claimed in claim 16, further comprising:

forming a plurality conductive connectors adjacent to the die, wherein the fillers are between two adjacent conductive connectors, and the longitudinal axis of each of the first fillers is perpendicular to an extended direction of the conductive connectors.

18. The method for forming the package structure as claimed in claim 16, further comprising:

a plurality of conductive connectors between the die and the first interconnect structure, wherein the fillers are between two adjacent conductive connectors.

19. The method for forming the package structure as claimed in claim 16, further comprising:

forming the first interconnect structure over a carrier substrate;

removing the carrier substrate;

removing a portion of the first interconnect structure to expose a conductive line in the interconnect structure; and forming a plurality of conductive connectors to electrically connect to the conductive line.

20. The method for forming the package structure as claimed in claim 16, wherein each of the fillers has a cylindrical-shaped or strip-shaped structure.

* * * * *